(12) United States Patent
Lee et al.

(10) Patent No.: US 11,158,686 B2
(45) Date of Patent: Oct. 26, 2021

(54) DISPLAY DEVICE

(71) Applicant: Samsung Display Co., Ltd., Yongin-Si (KR)

(72) Inventors: Hyeonbum Lee, Hwaseong-si (KR); Hyoeng-Ki Kim, Suwon-si (KR); Kwangwoo Park, Hwaseong-si (KR); Jin-whan Jung, Yongin-Si (KR)

(73) Assignee: Samsung Display Co., Ltd., Yongin-si (KR)

( * ) Notice: Subject to any disclaimer, the term of this patent is extended or adjusted under 35 U.S.C. 154(b) by 9 days.

(21) Appl. No.: 16/373,666

(22) Filed: Apr. 3, 2019

(65) Prior Publication Data

US 2019/0319075 A1    Oct. 17, 2019

(30) Foreign Application Priority Data

Apr. 12, 2018    (KR) .................. 10-2018-0042833

(51) Int. Cl.
*G06F 3/045*    (2006.01)
*H01L 27/32*    (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
CPC ............... H01L 27/323; H01L 27/3246; H01L 51/5281; H01L 51/5284; H01L 2251/303;
(Continued)

(56) References Cited

U.S. PATENT DOCUMENTS 9,536,930 B2    1/2017 Sasaki et al.
2015/0014663 A1*    1/2015 Kwak ............... H01L 21/02126
257/40

(Continued)

FOREIGN PATENT DOCUMENTS

EP    3276463    7/2017
JP    6134236    5/2017
(Continued)

OTHER PUBLICATIONS

European Search Report dated Aug. 23, 2019, issued in European Patent Application No. 19168053.

*Primary Examiner* — Adam R. Giesy
(74) *Attorney, Agent, or Firm* — H.C. Park & Associates, PLC

(57) ABSTRACT

A display panel including a pixel defining layer including a first portion, in which an opening to expose the first electrode is defined, and a second portion, which is disposed on the first portion and overlaps the first portion. A plurality of thin-films are disposed on the second electrode. An insulation pattern is disposed on the plurality of thin-films, overlaps the pixel defining layer, and overlaps the second portion. A distance between the first portion, which overlaps the insulation pattern, of the sensing electrode and the base insulation layer is greater than that between the second portion, which non-overlaps the insulation pattern, of the sensing electrode and the base insulation layer.

7 Claims, 39 Drawing Sheets

(51) Int. Cl.
   *G06F 3/041*   (2006.01)
   *G06F 3/044*   (2006.01)
   *H01L 51/52*   (2006.01)

(52) U.S. Cl.
   CPC ...... *H01L 27/3246* (2013.01); *H01L 51/5281* (2013.01); *H01L 51/5284* (2013.01)

(58) Field of Classification Search
   CPC .......... H01L 2251/5338; H01L 27/326; H01L 27/3234; H01L 27/322; H01L 27/3244; G06F 3/0412; G06F 3/044; G06F 3/0448; G09G 2320/0214; G09G 2320/0209
   See application file for complete search history.

(56) References Cited

U.S. PATENT DOCUMENTS

| | | |
|---|---|---|
| 2017/0168616 A1 | 6/2017 | Feng |
| 2017/0185180 A1 | 6/2017 | Chae |
| 2017/0199597 A1 | 7/2017 | Son et al. |
| 2017/0271429 A1 | 9/2017 | Kim et al. |
| 2017/0293378 A1 | 10/2017 | Ahn et al. |
| 2018/0033830 A1 | 2/2018 | Kim et al. |

FOREIGN PATENT DOCUMENTS

| | | |
|---|---|---|
| KR | 10-2015-0069712 | 6/2015 |
| KR | 10-2017-0083670 | 7/2017 |
| KR | 10-2017-0116319 | 10/2017 |

\* cited by examiner

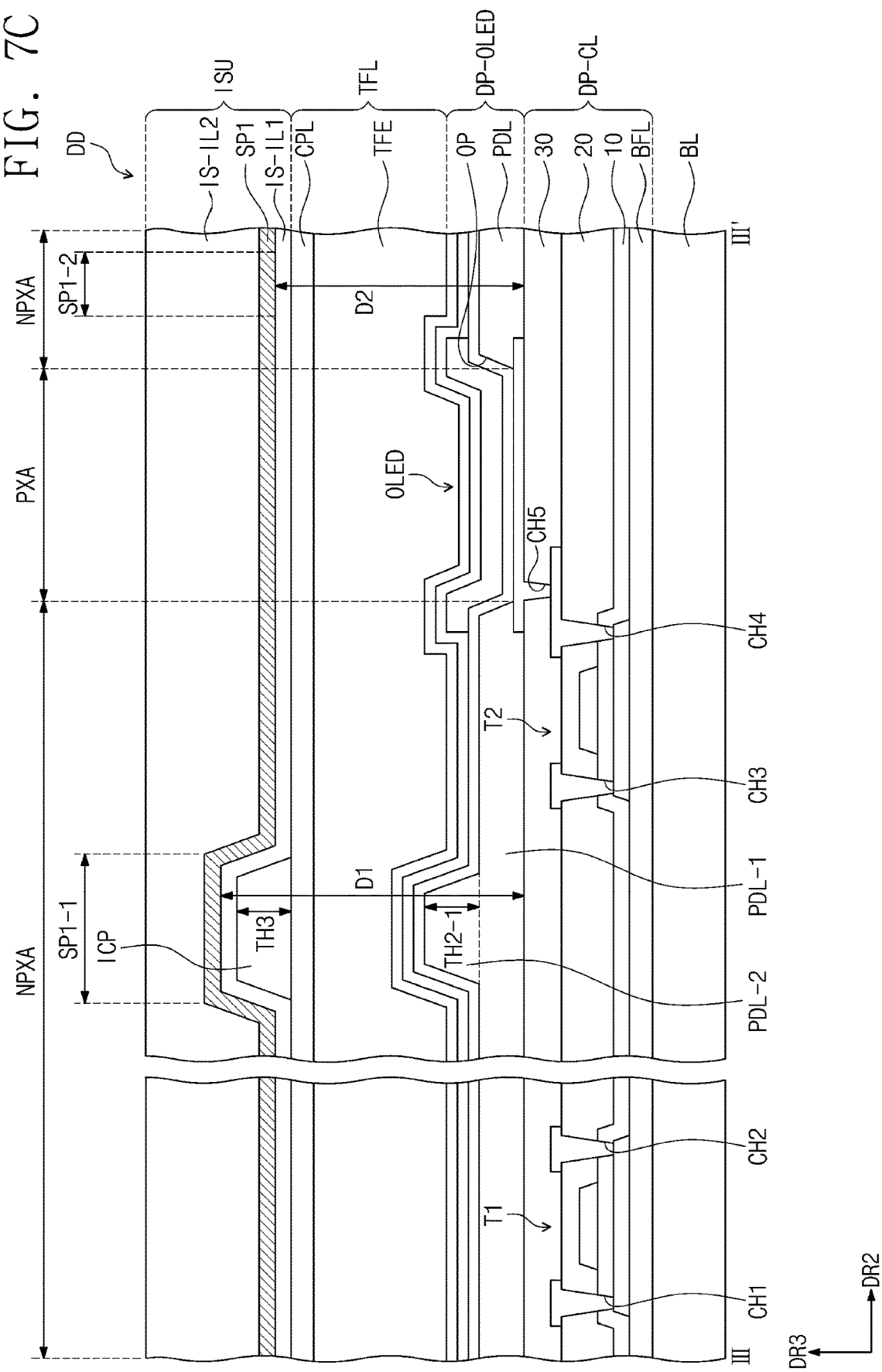

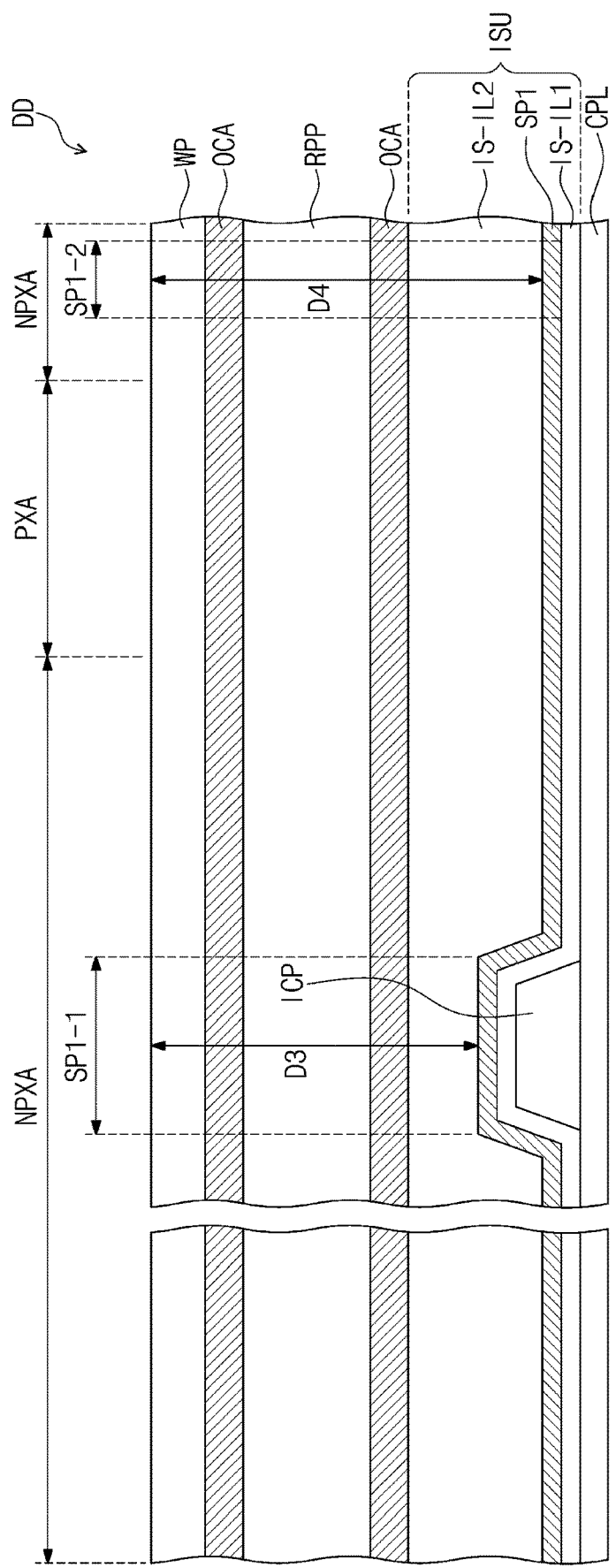

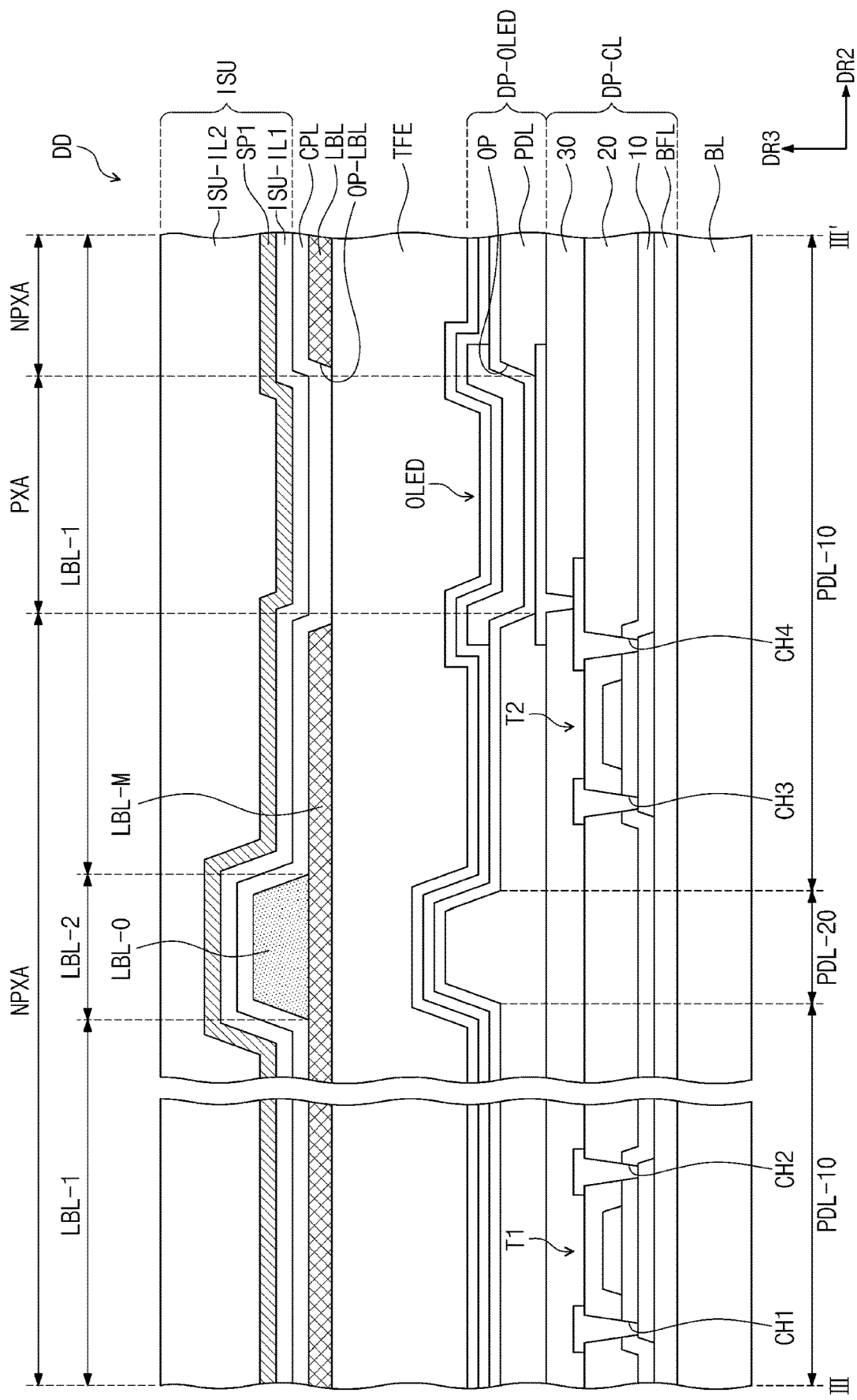

DISPLAY DEVICE

CROSS-REFERENCE TO RELATED APPLICATION

This application claims priority from and the benefit of Korean Patent Application No. 10-2018-0042833, filed on Apr. 12, 2018, which is hereby incorporated by reference for all purposes as if fully set forth herein.

BACKGROUND

Field

Exemplary embodiments of the invention relate generally to a display device, and more specifically, to a display device integrated with an input sensing unit.

Discussion of the Background

Various kinds of display devices, which are used for multimedia devices, such as a television, a mobile phone, a tablet computer, a navigation unit, and a game console, have been developed. The display devices include a keyboard or a mouse as an input unit. Also, in recent years, the display devices include a touch panel as the input unit.

However, signals of the display devices may include excessive noise levels, which result in decreased touch sensitivity.

The above information disclosed in this Background section is only for enhancement of understanding of the Background of the invention and therefore it may contain information that does not constitute prior art.

SUMMARY

Exemplary embodiments of the invention provide an input sensing unit integrated display device having a reduced noise level.

Additional features of the inventive concepts will be set forth in the description which follows, and in part will be apparent from the description, or may be learned by practice of the inventive concepts.

An exemplary embodiment of the inventive concept provides a display device including: a display panel; and an input sensing unit including a sensing electrode and disposed directly on the display panel. The display panel includes a light emitting element, a pixel defining layer, a plurality of thin-films, and an insulation pattern. The light emitting element includes a first electrode, which contacts a base insulation layer, a second electrode, and a light emitting layer disposed therebetween. The pixel defining layer includes a first portion, in which an opening configured to expose the first electrode is defined, and a second portion, which is disposed on the first portion and partially overlaps the first portion. The pixel defining layer is disposed below the second electrode and contacts with the base insulation layer. The plurality of thin-films are disposed on the second electrode. The insulation pattern is disposed on the plurality of thin-films, partially overlaps the pixel defining layer, and overlaps the second portion.

A distance between a first portion, which overlaps the insulation pattern, of the sensing electrode and the base insulation layer is greater than the distance between a second portion, which non-overlaps the insulation pattern, of the sensing electrode and the base insulation layer.

A distance between the first portion of the sensing electrode and the second electrode may be substantially the same as that between the second portion of the sensing electrode and the second electrode.

The second portion of the pixel defining layer may have a thickness, which is substantially the same as that of the insulation pattern.

The second portion of the pixel defining layer may overlap about 90% or more of the insulation pattern on a plane.

One side of the second portion of the pixel defining layer may have a length or a diameter of about 10 μm to about 25 μm on a plane.

The first portion of the pixel defining layer and the second portion of the pixel defining layer may have a single body.

The sensing electrode may have a mesh shape in which an opening corresponding to the opening of the first portion of the pixel defining layer is defined.

The display device may further include an anti-reflection unit disposed directly on the input sensing unit and including a light shielding layer in which an opening corresponding to the opening of the first portion of the pixel defining layer is defined.

Another exemplary embodiment of the inventive concept provides a display device including: a display panel; and an input sensing unit including a sensing electrode and disposed directly on the display panel. The display panel includes a light emitting element, a pixel defining layer, a plurality of thin-films, and an insulation pattern. The light emitting element includes a first electrode disposed on a base insulation layer, a second electrode, and a light emitting layer disposed therebetween. The pixel defining layer includes a first portion, in which an opening to expose the first electrode is defined, and a second portion, which is disposed adjacent to the first portion and has a thickness greater than that of the first portion, and disposed between the second electrode and the base insulation layer. The plurality of insulation layers are disposed on the second electrode. One of the plurality of insulation layers includes a first area, which overlaps the first portion of the pixel defining layer, and a second area, which overlaps the second portion of the pixel defining layer and has a thickness greater than that of the first area.

A thickness difference between the second area and the first area may be substantially the same as that between the second portion and the first portion.

The second portion may overlap about 90% or more of the second area on a plane.

The sensing electrode may contact the one of the plurality of insulation layers.

The plurality of insulation layers may include a first inorganic layer contacting the second electrode, a second inorganic layer disposed on the first inorganic layer, an organic layer disposed on the second inorganic layer, a third inorganic layer disposed on the organic layer, and a fourth inorganic layer disposed on the third inorganic layer. The one of the plurality of insulation layers may be one of the first inorganic layer, the second inorganic layer, the organic layer, and the third inorganic layer.

The one of the plurality of insulation layers may be formed with an opening corresponding to the opening of the first portion.

The one of the insulation layers may contain a light shielding material.

Another exemplary embodiment of the inventive concept provides a display device including: a display panel; and an input sensing unit including a sensing electrode and disposed directly on the display panel. The display panel includes a light emitting element, a pixel defining layer, a plurality of thin-films, and a light shielding layer. The light emitting element includes a first electrode disposed on a base insulation layer, a second electrode, and a light emitting layer disposed therebetween. The pixel defining layer includes a first portion, in which an opening to expose the first electrode is defined, and a second portion, which is disposed adjacent to the first portion and has a thickness greater than that of the first portion, and disposed between the second electrode and the base insulation layer. The plurality of thin-films are disposed on the second electrode. The light shielding layer is disposed on the plurality of thin-films, and an opening corresponding to the opening of the first portion is defined therein. The light shielding layer includes a first area, which overlaps the first portion of the pixel defining layer, and a second area, which overlaps the second portion of the pixel defining layer and has a thickness greater than that of the first area.

The light shielding layer may include: a metal containing layer overlapping the first area and the second area; and an organic material pattern overlapping the second area.

The organic material pattern may have a thickness that is substantially the same as a thickness difference between the second area and the first area.

The metal containing layer may contain a molybdenum tantalum oxide ($MoTaO_x$).

Another exemplary embodiment of the inventive concept provides a display device including: a display panel; an input sensing unit including a sensing electrode and disposed directly on the display panel; and a window unit disposed on the input sensing unit. The display panel includes: first electrodes disposed on a base insulation layer; a pixel defining layer including a first portion, in which openings to expose the first electrode are defined, and a second portion, which is disposed on the first portion and partially overlaps the first portion, and disposed the base insulation layer; a second electrode disposed on the pixel defining layer; at least one light emitting layer disposed between the second electrode and the first electrodes; and an insulation structure. The insulation structure forms a stepped portion between a first area of the sensing electrode, which overlaps the first portion of the pixel defining layer, and a second area of the sensing electrode, which overlaps the second portion of the sensing electrode, and disposed on the second electrode.

A distance between a top surface of the window unit and the first area of the sensing electrode may be less than that between the top surface of the window unit and the second area of the sensing electrode.

A distance between the first portion of the pixel defining layer and the first area of the sensing electrode may be substantially the same as that between the second portion of the sensing electrode and the second area of the sensing electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 7C and 7D are enlarged cross-sectional views illustrating a display device according to an exemplary embodiment of the inventive concept.

FIGS. 11A to 11D are cross-sectional views illustrating a display device according to an embodiment of the inventive concept;

DETAILED DESCRIPTION

Figure 1:
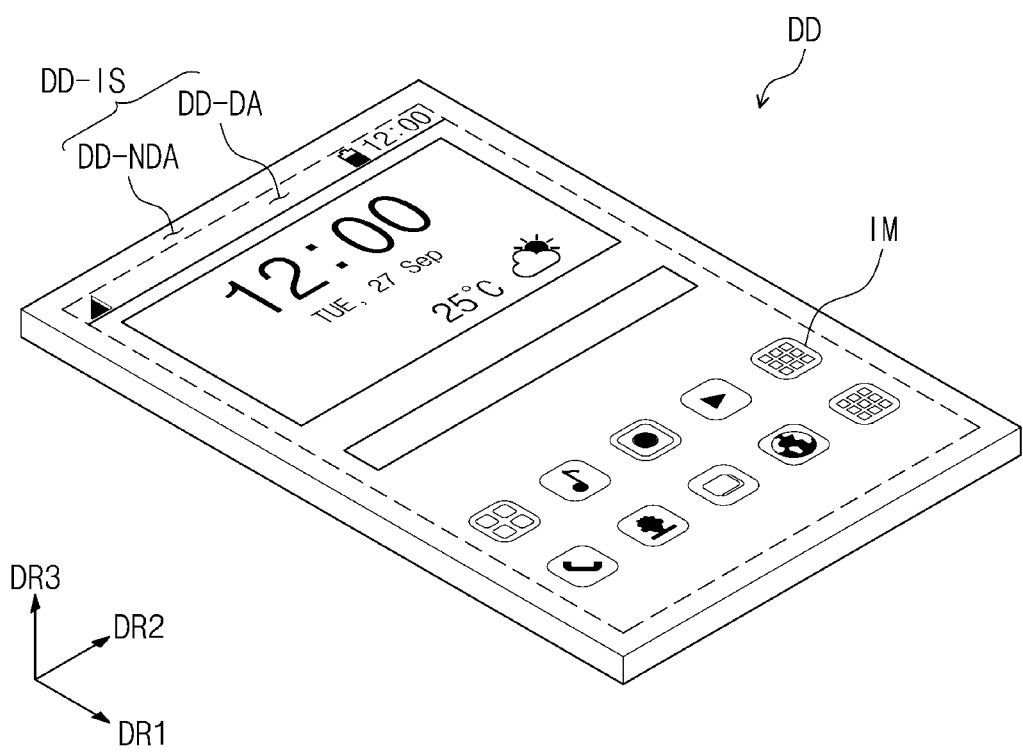
FIG. 1 is a perspective view illustrating a display device according to an exemplary embodiment of the inventive concept.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating a display device DD according to an exemplary embodiment of the inventive concept. As illustrated in FIG. 1, the display device DD may display an image IM through a display surface DD-IS. The display surface DD-IS is parallel to a surface defined by a first directional axis DR1 and a second directional axis DR2. A normal direction of the display surface DD-IS, i.e., a thickness direction of the display device DD, indicates a third directional axis DR3.

Hereinafter, a front surface (or top surface) and a rear surface (or bottom surface) of each of members or units are distinguished by the third direction DR3. However, the inventive concept is not limited to the first to third directional axes DR1, DR2, and DR3 as shown in the exemplary embodiments. Hereinafter, first to third directions may be directions indicated by the first to third directional axes DR1, DR2, and DR3 and designated by the same reference numerals, respectively.

Although the display device DD including a planar-type display surface is illustrated, the inventive concept is not limited thereto. For example, the display device DD may include a curved-type display surface or a three dimensional-type display surface. The three dimensional-type display surface may include a plurality of display areas indicating different directions from each other, e.g., a polygonal column-type display surface.

The display device DD according to the exemplary embodiment may be a rigid display device. However, the inventive concept is not limited thereto. For example, the display device DD according to the inventive concept may be a flexible display device DD. A display device DD, which may be applied to a mobile terminal, is exemplarily illustrated. Although not shown, electronic modules, camera modules, and power modules, which are mounted on a main board, may be disposed on a bracket or a case together with the display device DD to constitute the mobile terminal. The display device DD according to the inventive concept may be used for large-sized electronic devices such as televisions and monitors and small and middle-sized electronic devices such as tablet PCs, navigation units for vehicles, game consoles, and smart watches.

As illustrated in FIG. 1, the display surface DD-IS may include a display area DD-DA on which the image IM is displayed and a non-display area DD-NDA adjacent to the display area DD-DA. The non-display area DD-NDA may be an area on which an image is not displayed. FIG. 1 illustrates icon images as an example of the image IM.

As illustrated in FIG. 1, the display area DD-DA may have a rectangular shape. The non-display area DD-NDA may surround the display area DD-DA. However, the inventive concept is not limited thereto. For example, the display area DD-DA and the non-display area DD-NDA may be relatively designed in shape.

FIGS. 2A to 2D are cross-sectional views illustrating a display device DD according to an exemplary embodiment of the inventive concept. FIGS. 2A to 2D illustrate a cross-section defined by the second directional axis DR2 and the third directional axis DR3. FIGS. 2A to 2D are illustrated in a simplified manner in order to explain a lamination relationship between a display panel and functional units, which constitute the display device DD.

The display device DD according to an exemplary embodiment of the inventive concept may include a display panel, an input sensing unit, anti-reflection unit, and a window unit. At least some of the display panel, the input sensing unit, the anti-reflection unit, and the window member may be formed through a continuous process or may be coupled to each other by using an adhesion member. In FIGS. 2A to 2D, an optically clear adhesive member OCA is exemplarily illustrated as an adhesive member. Hereinafter, the adhesive member may include a typical adhesive or sticking agent. In an exemplary embodiment of the inventive concept, the anti-reflection unit and the window unit may be omitted or replaced by a different component.

In FIGS. 2A to 2D, among the input sensing unit, the anti-reflection unit, and the window unit, a component formed with another component through a continuous process is expressed by a "layer". Among the input sensing unit, the anti-reflection unit, and the window unit, a component coupled another component through an adhesive member is expressed by a "panel". The panel may include a base layer providing a base surface, e.g., a synthetic resin film, a composite material film, or a glass substrate. However, the "layer" may not include the base layer. That is, the unit expressed by "layer" is disposed on a base surface provided by another unit.

The input sensing unit, the anti-reflection unit, and the window unit may be referred to as an input sensing panel ISP, an anti-reflection panel RPP, and a window panel WP or an input sensing layer ISL, an anti-reflection layer RPL, and a window layer WL according to whether a base layer exists or not.

Figure 2A:
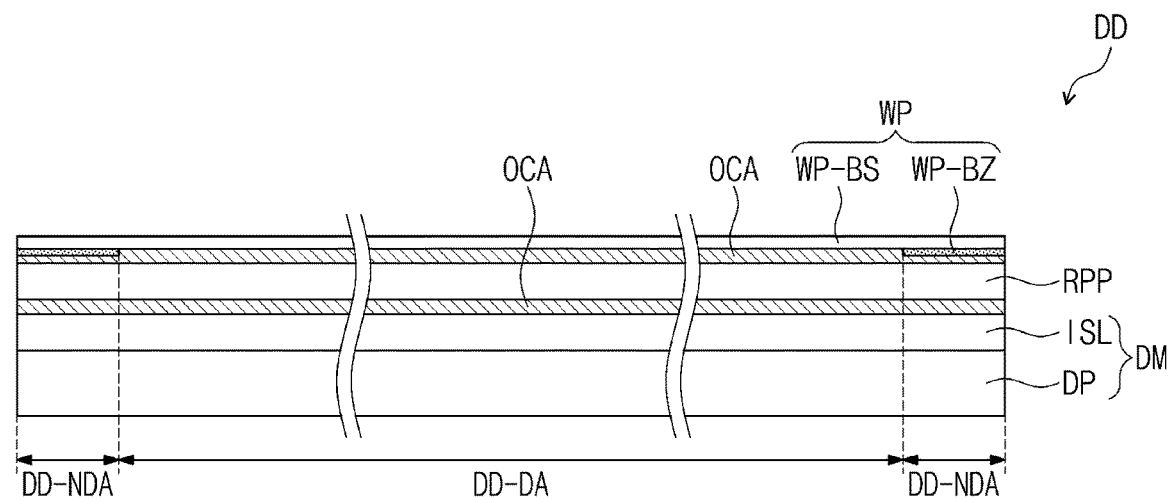
FIGS. 2A, 2B, 2C, and 2D are cross-sectional views illustrating a display device according to an exemplary embodiment of the inventive concept.

As illustrated in FIG. 2A, the display device DD may include the input sensing layer ISL, and the anti-reflection panel RPP, and the window panel WP. The input sensing layer ISL is disposed directly on the display panel DP. In this specification, a wording of "B component is disposed directly on A component" represents that an additional adhesive layer/adhesive member is not disposed between the A component and the B component. The B component may be formed on a base surface provided by the A component through a continuous process after the A component is formed.

The display module DM may be defined by including the display panel DP and the input sensing layer ISL disposed directly on the display panel DP. The optically clear adhesive member OCA is disposed between the display module DM and the anti-reflection panel RPP and between the anti-reflection panel RPP and the window panel WP.

The display panel DP generates an image, and the input sensing layer ISL acquires coordinate information of an external input (e.g., touch event). Although not separately shown, the display module DM according to an exemplary embodiment of the inventive concept may further include a protection member disposed on a bottom surface of the display panel DP. The protection member and the display panel DP may be coupled through the adhesive member. Hereinafter, the display devices DD in FIGS. 2B to 2D may also further include the protection member.

Although the pixel PX according to an exemplary embodiment of the inventive concept may be a light emitting type pixel, the inventive concept is not so limited. For example, the display panel DP may be an organic light emitting display panel or a quantum dot light emitting display panel. The organic light emitting display panel may include a light emitting layer containing an organic light emitting material. The quantum dot light emitting display panel may include a light emitting layer containing a quantum dot and a quantum rod. Hereinafter, the display panel DP will be described as an organic light emitting display panel.

The anti-reflection panel RPP decreases reflectance of external light, which is incident from above the window panel WP. The anti-reflection panel RPP according to an exemplary embodiment of the inventive concept may include a retarder and a polarizer. The retarder may be a film type or a liquid crystal coating type and include a $\lambda/2$ retarder and/or a $\lambda/4$ retarder. The polarizer also may be a film type or a liquid crystal coating type. The film type may include a flexible synthetic resin film, and the liquid crystal coating type may include liquid crystals having a predetermined orientation. Each of the retarder and the polarizer may further include a protective film. The retarder and the polarizer itself or the protective film may be defined as the base layer of the anti-reflection panel RPP. The anti-reflection panel RPP according to an exemplary embodiment of the inventive concept may include a destructive interference structure. For example, the destructive interference structure may include a first reflective layer and a second reflective layer, which are disposed on layers different from each other. First and second reflected light, which are reflected by the first and second reflective layers, respectively, may be destructive-interfered, and, accordingly, the reflectance of the external light may decrease.

The window panel WP according to an exemplary embodiment of the inventive concept includes a base film WP-BS and a bezel pattern WP-BZ. The base film WP-BS may include a glass substrate and/or a synthetic resin film. The inventive concept is not limited to the number of layers of the base film WP-BS. For example, the base film WP-BS may include two or more films that are coupled through an adhesive member.

The bezel pattern WP-BZ partially overlaps the base film WP-BS. The bezel pattern WP-BZ may be disposed on a rear surface of the base film WP-BS to define a bezel area, i.e., the non-display area DD-NDA (refer to FIG. 1), of the display device DD.

The bezel pattern WP-BZ may be a colored organic layer and formed through, e.g., a coating method. The bezel pattern WP-BZ may include multi-layers of organic layers. Some of the organic layers may be formed with a predetermined pattern. Although not separately shown, the window panel WP may further include a functional coating layer disposed on a front surface of the base film WP-BS. The functional coating layer may include an anti-fingerprint layer, an anti-reflection layer, and a hard coating layer.

Figure 2B:
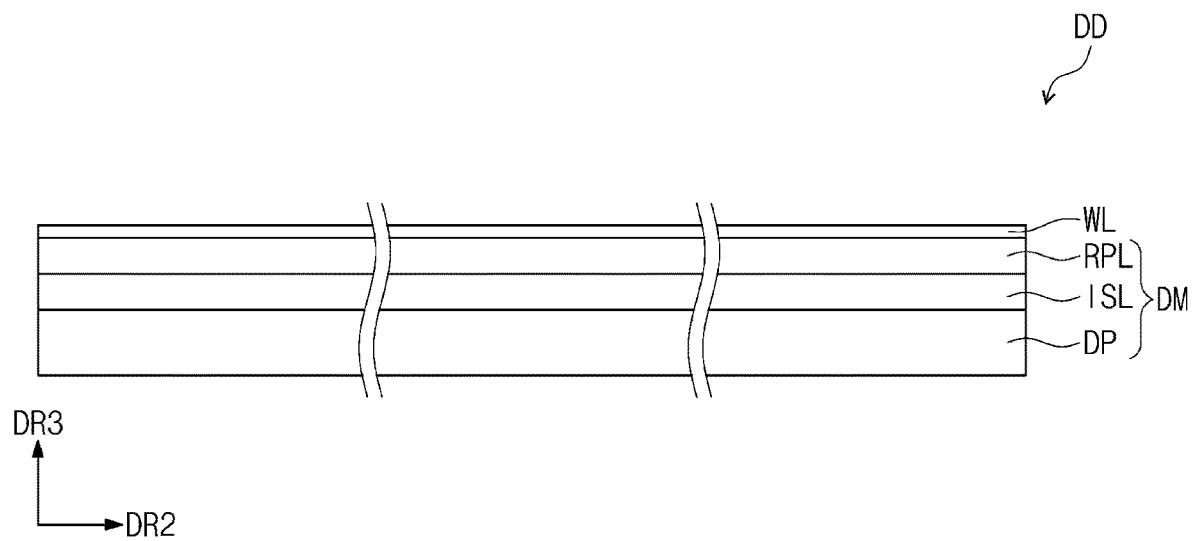
Figure 2C:
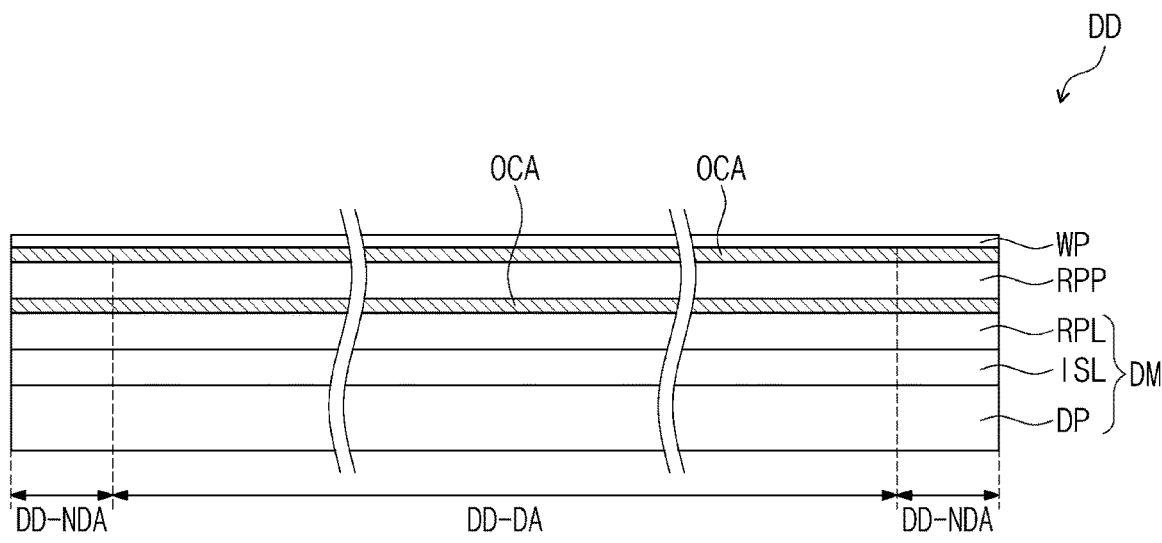
Figure 2C:
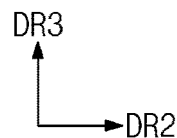
Figure 2D:
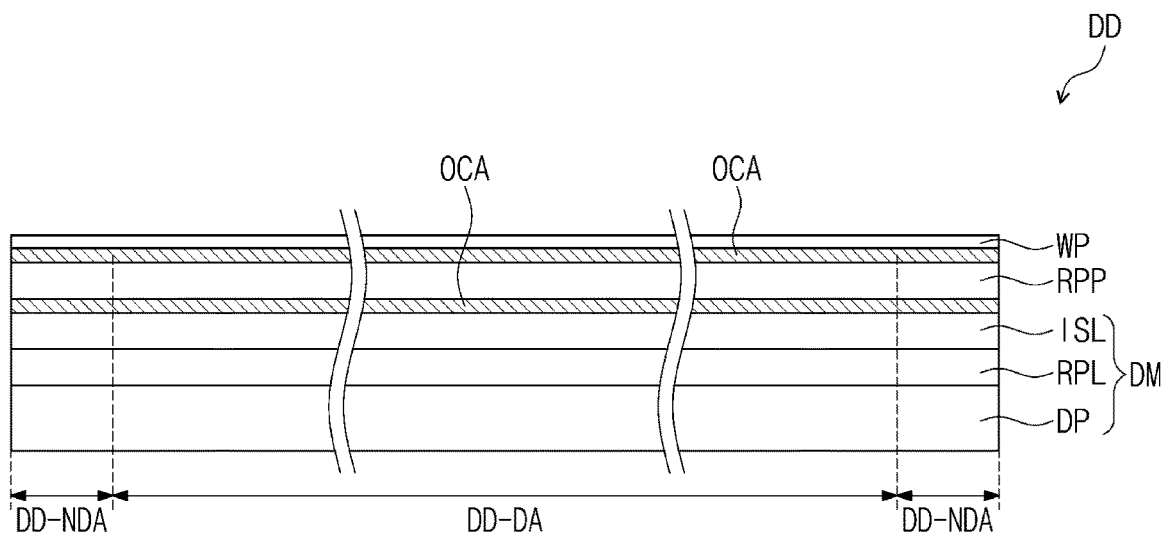
Figure 2D:
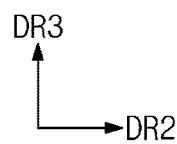

In FIGS. 2B to 2D, the window panel WP is simply illustrated without dividing the bezel pattern WP-BZ and the base film WP-BS.

As illustrated in FIG. 2B, the display device may include a display panel DP, an input sensing layer ISL, an anti-reflection layer RPL, and a window layer WL. The adhesive members may be omitted from the display device DD, and the input sensing layer ISL, the anti-reflection layer RPL, and the window layer WL may be formed on a base surface provided by the display panel DP. The input sensing layer ISL and the anti-reflection layer RPL may be changed in lamination order. In an exemplary embodiment of the inventive concept, one of the anti-reflection layer RPL and the window layer WL may be changed into the panel type.

As illustrated in FIGS. 2C and 2D, the display device DD may include two kinds of anti-reflection units. As illustrated in FIG. 2C, the anti-reflection layer RPL may be disposed directly on the input sensing layer ISL. As illustrated in FIG. 2D, the anti-reflection layer RPL may be disposed directly on the display panel DP, and the input sensing layer ISL may be disposed directly on the anti-reflection layer RPL.

Coupling between the anti-reflection layer RPL and the anti-reflection panel RPP and between the input sensing layer ISL and the anti-reflection panel RPP may be performed by the optically clear adhesive member OCA. Here, the anti-reflection panel RPP may include a polarizing film, and the anti-reflection layer RPL may include at least light shielding patterns.

Although the input sensing unit entirely overlap the display panel DP in FIGS. 2A to 2D, the inventive concept is not limited thereto. For example, the input sensing unit may overlap only the display area DD-DA. In an exemplary embodiment of the inventive concept, the input sensing unit may overlap a portion of the display area DD-DA or overlap only the non-display area DD-NDA.

The input sensing unit may be a touch sensing panel for sensing a touch of a user or a fingerprint sensing panel for sensing fingerprint information of a finger of the user. Hereinafter, pitches and widths of sensing electrodes may be varied according to purposes of the input sensing unit. Each of sensing electrodes of the touch sensing panel may have a width of several mm to several tens mm, and each of sensing electrodes of the fingerprint sensing panel may have a width of several tens μm to several hundreds μm.

According to the display device DD illustrated with reference to FIGS. 2A to 2D, the input sensing layer ISL may have a distance to the display panel DP, which is less than the panel-type input sensing unit. Accordingly, sensitivity of the input sensing layer ISL may be greatly affected by noises generated by the display panel DP.

Figure 3A:
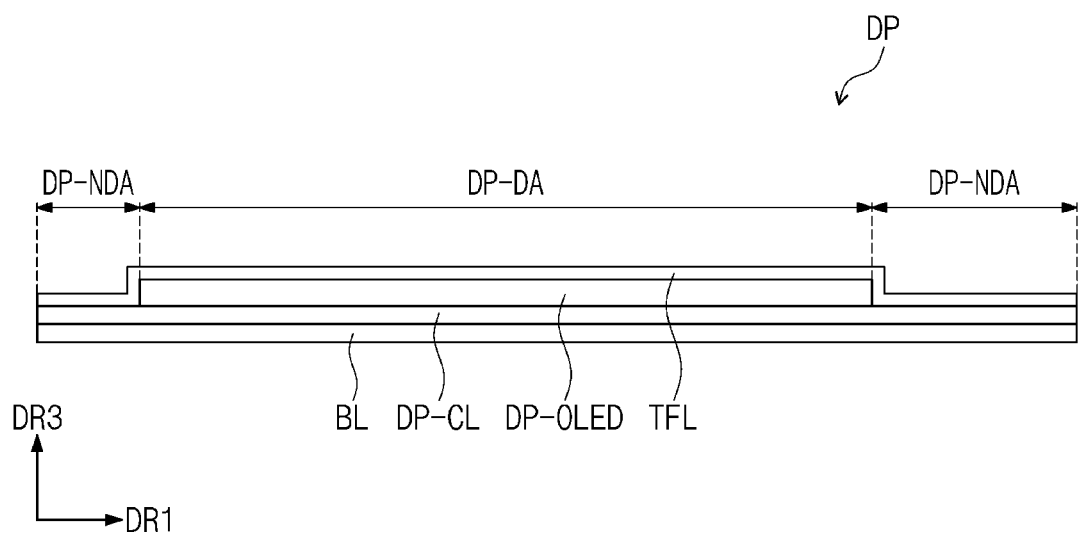
FIG. 3A is a cross-sectional view illustrating a display module according to an exemplary embodiment of the inventive concept.

FIG. 3A is a cross-sectional view illustrating a display panel DP according to an exemplary embodiment of the inventive concept. FIG. 3 is a plan view illustrating a display panel DP according to an exemplary embodiment of the inventive concept. FIG. 3C is an equivalent circuit diagram of a pixel PX according to an exemplary embodiment of the inventive concept. FIGS. 3D and 3E are enlarged cross-sectional views illustrating a display panel DP according to an exemplary embodiment of the inventive concept. The display panel DP, which will be described below, may be applied to all of display devices DD described with reference to FIGS. 2A to 2D.

As illustrated in FIG. 3A, the display panel DP includes a base layer BL, a circuit element layer DP-CL disposed on the base layer BL, a display element layer DP-OLED disposed on the circuit element layer DP-CL, and an insulation layer TFL (hereinafter, referred to as an "upper insulation layer") disposed on the display element layer DP-OLED.

The base layer BL may include a synthetic resin film. A synthetic resin layer is formed on a working substrate that is used while the display panel DP is manufactured. Thereafter, a conductive layer, an insulation layer, and the like are formed on the synthetic resin layer. When the working substrate is removed, the synthetic resin layer corresponds to the base layer BL. Although the synthetic resin layer may include a polyimide-based resin layer, the inventive concept is not limited to the material of the synthetic resin layer. Besides, the base layer BL may include a glass substrate, a metal substrate, and/or, an organic/inorganic composite material substrate.

The circuit element layer DP-CL includes at least one insulation layer and a circuit element. Hereinafter, the insulation layer provided in the circuit element layer DP-CL is referred to as an intermediate insulation layer. The intermediate insulation layer includes at least one intermediate inorganic layer and at least one intermediate organic layer. The circuit element includes a signal line and a driving circuit of a pixel. The circuit element layer DP-CL may be formed through a process of forming an insulation layer, a semiconductor layer, and a conductive layer through coating and deposition, a process of patterning the insulation layer, the semiconductor layer, and the conductive layer through a photolithography process.

The display element layer DP-OLED includes a light emitting element. The display element layer DP-OLED may include organic light emitting diodes as the light emitting element. The display element layer DP-OLED may further include an organic layer, such as a pixel defining layer.

The upper insulation layer TFL may include a thin-film encapsulation layer for sealing the circuit element layer DP-CL, which will be described later. The upper insulation layer TFL may further include functional layers, such as a capping layer, an anti-reflection layer, and a refractive index adjusting layer.

Figure 3B:
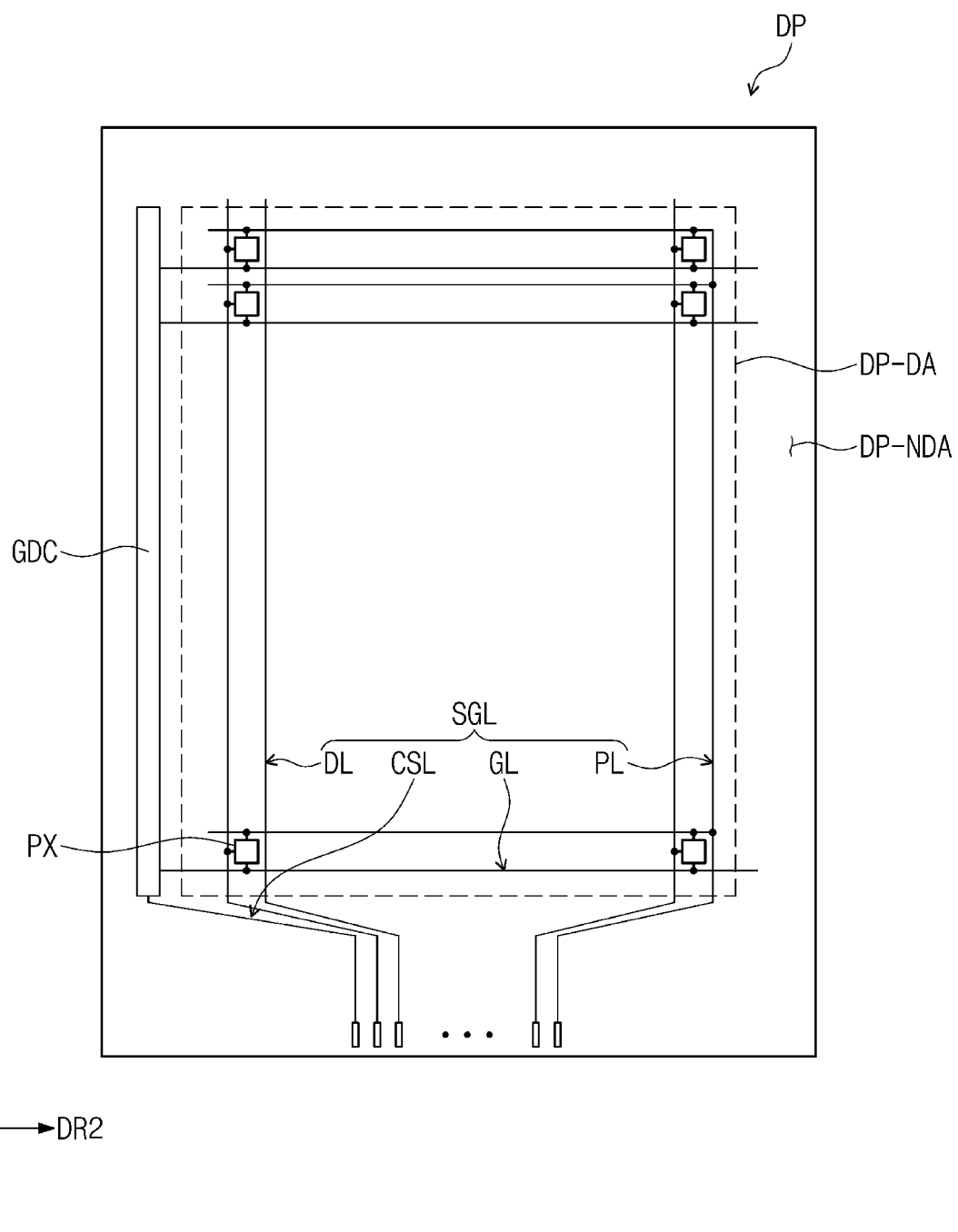
FIG. 3B is a plan view illustrating a display panel according to an exemplary embodiment of the inventive concept.
Figure 3C:
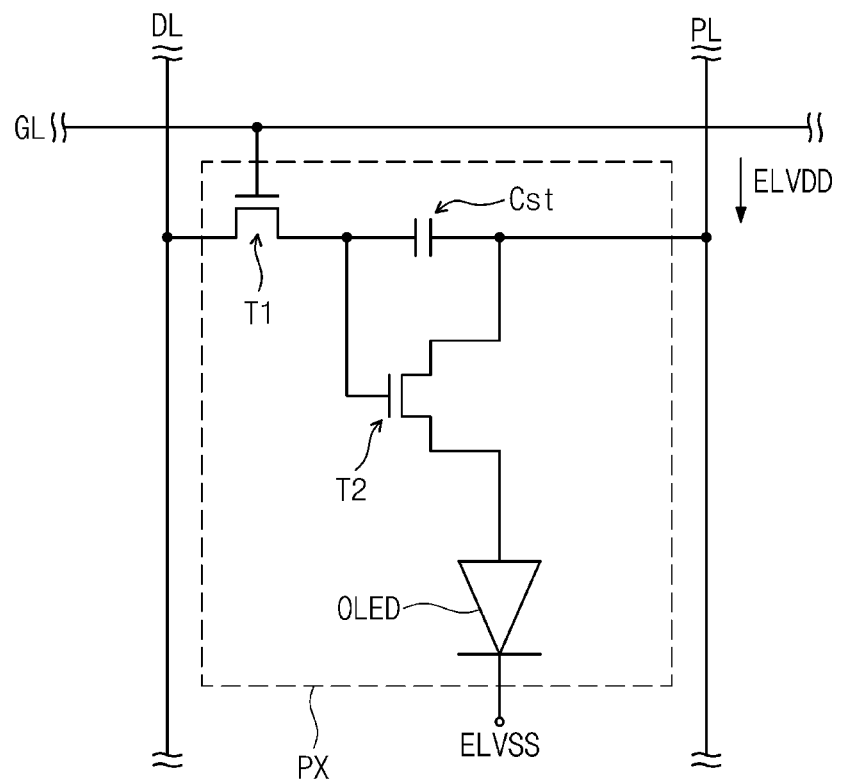
FIG. 3C is an equivalent circuit diagram illustrating a pixel according to an exemplary embodiment of the inventive concept.
Figure 3D:
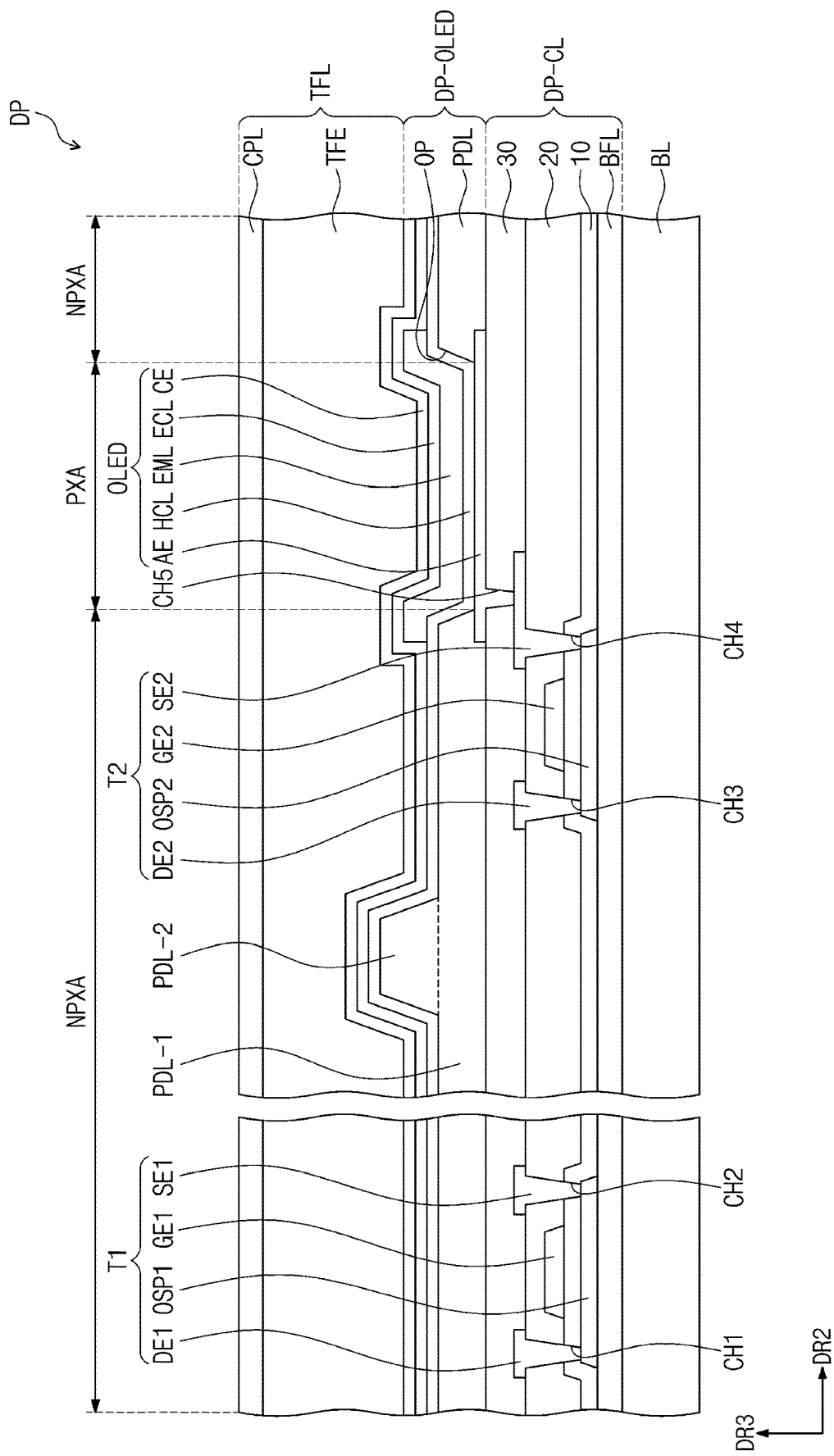
FIGS. 3D and 3E are enlarged cross-sectional views illustrating a display panel according to an exemplary embodiment of the inventive concept.
Figure 3E:
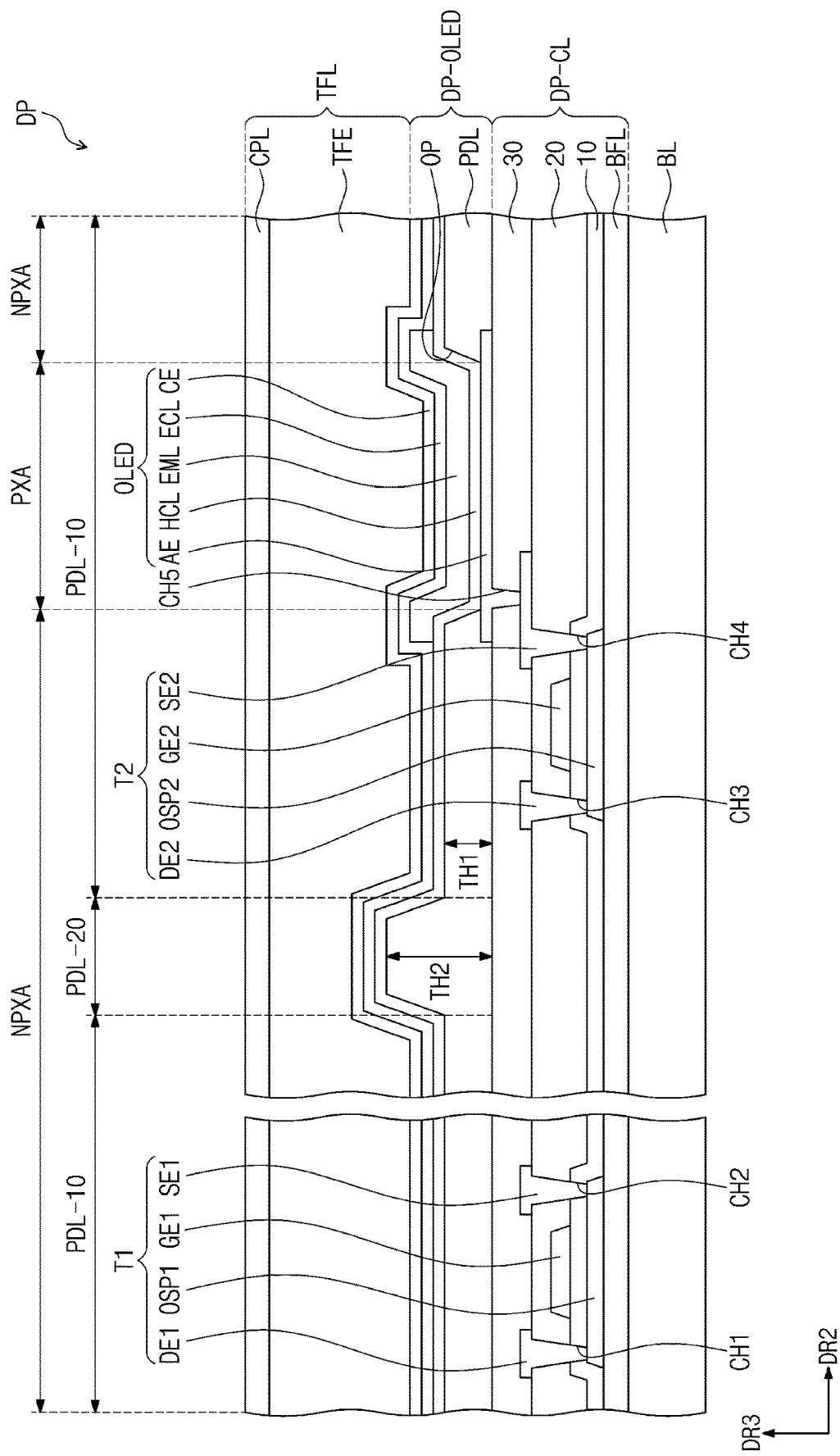

As illustrated in FIG. 3B, the display panel DP includes the display area DA and the non-display area NDA on a plane. In this exemplary embodiment, the non-display area DP-NDA may be defined along an edge of the display area DP-DA. The display area DP-DA and the non-display area DP-NDA of the display panel DP correspond to the display area DP-DA and the non-display area DP-NDA of the display panel DP in FIGS. 1 and 2D, respectively.

The display panel DP may include a driving circuit GDC, a plurality of signal lines SGL (hereinafter, referred to as signal lines), and a plurality of pixels PX (hereinafter, referred to as pixels). The pixels PX are disposed on the display area DP-DA. Each of the pixels PX includes a light emitting element and a pixel driving circuit connected to the light emitting element. The driving circuit GDC, the signal lines SGL, and the pixel driving circuit may be provided in the circuit element layer DP-CL in FIG. 3A.

The driving circuit GDC may include a scan driving circuit. The scan driving circuit generates a plurality of scan signals (hereinafter, referred to as scan signals) and sequentially outputs the scan signals to a plurality of scan lines GL (hereinafter, referred to as scan lines), which will be described later. The scan driving circuit may further output another control signal to a driving circuit of each of the pixels PX.

The scan driving circuit may include a plurality of thin-film transistors that are formed through the same process as the driving circuit, e.g., a low temperature polycrystalline silicon (LTPS) process or a low temperature polycrystalline oxide (LTPO) process.

The signal lines SGL includes scan lines GL, data lines DL, a power line PL, and a control signal line CSL. Each of the scan lines GL is connected to the corresponding pixel PX of the pixels PX, and each of the data lines DL is connected to the corresponding pixel PX of the pixels PX. The power line PL is connected to the pixels PX. The control signal line CSL may provide control signals to the scan driving circuit.

The signal lines SGL may be connected to a circuit board (not shown). That is, the signal lines SGL may be connected to an integrated chip-type timing control circuit that is mounted to the circuit board. In an exemplary embodiment of the inventive concept, the integrated chip may be disposed on the non-display area DP-NDA and connected to the signal lines SGL.

FIG. 3C exemplarily illustrates one of the scan lines GL, one of the data lines DL, the power line PL, and the pixel PX connected thereto. However, the embodiment of the inventive concept is not limited to the constitution of the pixel PX in FIG. 3C.

The organic light emitting diode OLED may be a front light emitting diode or a rear light emitting diode. The pixel PX, which is a pixel driving circuit for driving the organic light emitting diode OLED, includes a first transistor T1 (or a switching transistor), a second transistor T2 (or a driving transistor), and a capacitor Cst. The second transistor T2A is provided with a first power voltage ELVDD, and the organic light emitting diode OLED is provided with a second power voltage ELVSS. The second power voltage ELVSS may be less than the first power voltage ELVDD.

The first transistor T1 outputs a data signal applied to the data line DL in response to a scan signal applied to the scan line GL. The capacitor Cst charges a voltage corresponding to a data signal received from the first transistor T1. The second transistor T2 is connected to the organic light emitting diode OLED. The second transistor T2 controls a driving current flowing through the organic light emitting diode OLED in correspondence to an electric charge quantity stored in the capacitor Cst.

Although the equivalent circuit is provided as an example, the inventive concept is not limited thereto. The pixel PX may further include a plurality of transistors and a plurality of capacitors. The organic light emitting diode OLED may be connected between the power line PL and the second thin-film transistor T2.

FIGS. 3D and 3E are views illustrating a portion of a cross-section of the display panel DP corresponding to the equivalent circuit in FIG. 3C. Hereinafter, FIG. 3D will be mainly described.

The circuit element layer DP-CL, the display element layer DP-OLED, and the thin-film encapsulation layer TFE are sequentially arranged on the base layer BL. In this exemplary embodiment, the circuit element layer DP-CL may include a buffer layer BFL that is an inorganic layer, a first intermediate inorganic layer 10, a second intermediate inorganic layer 20, and an intermediate organic layer 30 that is an organic layer. However, the inventive concept is not particularly limited to the material of each of the inorganic layer and the organic layer. In an exemplary embodiment, the buffer layer BFL may be selectively provided or omitted.

A semiconductor pattern OSP1 (hereinafter, referred to as a first semiconductor pattern) of the first transistor TR1 and a semiconductor pattern OSP2 (hereinafter, referred to as a second semiconductor pattern) of the second transistor TR2 are disposed on the buffer layer BFL. The first semiconductor pattern OSP1 and the second semiconductor pattern OSP2 may be selected from amorphous silicon, poly silicon, and a metal oxide semiconductor.

The first intermediate inorganic layer 10 is disposed on the first semiconductor pattern OSP1 and the second semiconductor pattern OSP2. A control electrode GE1 (hereinafter, referred to as a first control electrode) of the first transistor TR1 and a control electrode GE2 (hereinafter, referred to as a second control electrode) of the second transistor TR2 are disposed on the first intermediate inorganic layer 10. The first control electrode GE1 and the second control electrode GE2 may be manufactured through the same photolithography process as the scan lines GL (refer to FIG. 3B).

The second intermediate inorganic layer 20 covering the first control electrode GE1 and the second control electrode GE2 is disposed on the first intermediate inorganic layer 10. An input electrode DE1 (hereinafter, referred to as a first input electrode) and an output electrode SE1 (hereinafter, referred to as a first output electrode) of the first transistor T1 and an input electrode DE2 (hereinafter, referred to as a second input electrode) and an output electrode SE2 (hereinafter, referred to as a second output electrode) of the second transistor T2 are disposed on the second intermediate inorganic layer 20.

The first input electrode DE1 and the first output electrode SE1 are connected to the first semiconductor pattern OSP1 through a first through-hole CH1 and a second through-hole CH2, which pass through the first intermediate inorganic layer 10 and the second intermediate inorganic layer 20, respectively. The second input electrode DE2 and the second output electrode SE2 are connected to the second semiconductor pattern OSP2 through a third through-hole CH3 and a fourth through-hole CH4, which pass through the first intermediate inorganic layer 10 and the second intermediate inorganic layer 20, respectively. In another exemplary embodiment of the inventive concept, one of the first and second transistors T1 and T2 may be formed as a bottom gate structure.

The intermediate organic layer 30 covering the first input electrode DE1, the second input electrode DE2, the first output electrode SE1, and the second output electrode SE2 is disposed on the second intermediate inorganic layer 20. The intermediate organic layer may provide a planar surface.

The display element layer DP-OLED is disposed on the intermediate organic layer 30. The display element layer DP-OLED may include a pixel defining layer PDL and an organic light emitting diode OLED. A first electrode AE is disposed on the intermediate organic layer 30. The first electrode AE is connected to the second output electrode SE2 through a fifth through-hole CH5 passing through the intermediate organic layer 30. An opening OP is defined in the pixel defining layer PDL. The opening OP of the pixel defining layer PDL exposes at least a portion of the first electrode AE.

As illustrated in FIG. 3D, the pixel defining layer PDL may be divided into two portions. The pixel defining layer PDL may include a first portion PDL-1, in which the opening OP exposing the first electrode AE is defined, and a second portion PDL-2 disposed on the first portion PDL-1 and partially overlapping the first portion PDL-1. That is, the first portion PDL-1 and the second portion PDL-2 may be distinguished in the third direction DR3. The first portion PDL-1 may contact the intermediate organic layer 30, and the intermediate organic layer 30 may be defined as a base insulation layer in the embodiment.

As illustrated in FIG. 3E, the pixel defining layer PDL may be divided into two portions on a plane. FIG. 3E is illustrated with reference to the second direction DR2. The pixel defining layer PDL may include a first portion PDL-10, in which the opening OP exposing the first electrode AE is defined, and a second portion PDL-20 disposed adjacent to the first portion PDL-10 and having a thickness greater than the first portion PDL-10.

The first portion PDL-10 may have a thickness TH1 that is about 40% to about 60% of a thickness TH2 of the second portion PDL-20. The thickness TH2 of the second portion PDL-20 is measured at a central area of the second portion PDL-20.

The pixel defining layer PDL, which is divided into the two portions, may be formed by removing a portion thereof using a half-tone mask. Accordingly, the two portions may have an integrated shape. In an exemplary embodiment of the inventive concept, the pixel defining layer PDL may be formed such that an insulation layer corresponding to the first portion PDL-1, which is described in FIG. 3D, is formed, and then the a spacer corresponding to the second portion PDL-2 is printed. Accordingly, the two portions have an interface therebetween.

The display area DP-DA in FIG. 3E may include a light emitting area PXA and a non-light emitting area NPXA adjacent to the light emitting area PXA, as illustrated in FIG. 3D. The non-light emitting area NPXA may surround the light emitting area PXA. In this embodiment, the light emitting area PXA is defined in correspondence to a partial area, which is exposed by the opening OP, of the first electrode AE.

In an exemplary embodiment of the inventive concept, the light emitting area PXA may overlap at least one of the first and second transistors T1 and T2. The opening OP may be further widened, and each of the first electrode AE and a light emitting layer EML, which will be described later, may be further widened.

A hole control layer HCL may be disposed on the light emitting area PXA and the non-light emitting area NPXA in common. Although not separately shown, a common layer, such as the hole control layer HCL may be provided in common on the pixels PX (refer to FIG. 3B). The hole control layer HCL may include a hole transporting layer and a hole injection layer.

The light emitting layer EML is disposed on the hole control layer HCL. The light emitting layer EML may be disposed on an area corresponding to the opening OP. That is, the light emitting layer EML may be separately provided on each of the pixels PX. The light emitting layer EML may contain an organic material and/or an inorganic material. The light emitting layer EML may generate color light having a predetermined color.

An electron control layer ECL is disposed on the light emitting layer EML. Although not separately shown, the electron control layer ECL may be provided in common on the pixels PX (refer to FIG. 3B). The electron control layer ECL may include an electron transporting layer and an electron injection layer. A second electrode CE is disposed on the electron control layer ECL. The second electrode CE is disposed in common on the pixels PX.

An upper insulation layer is disposed on the second electrode CE. The upper insulation layer may include a plurality of thin-films. Like the previous exemplary embodiment, the upper insulation layer may include a thin-film encapsulation layer TFE, in which a plurality of thin-films are distinguished in function, and a capping layer CPL.

In this exemplary embodiment, the thin-film encapsulation layer TFE may entirely overlap the display area DP-DA in FIGS. 3A and 3B. The thin-film encapsulation layer TFE seals the organic light emitting diode OLED disposed on the display area DP-DA. The thin-film encapsulation layer TFE is not disposed on the non-display area DP-NDA or disposed on only a partial area of the non-display area DP-NDA. A detailed lamination structure of the thin-film encapsulation layer TFE will be described later.

The capping layer CPL may be disposed on an entire area of the display area DP-DA and the non-display area DP-NDA. The capping layer CPL seals the thin-film encapsulation layer TFE. When the thin-film encapsulation layer TFE is disposed on the entire area of the display area DP-DA and the non-display area DP-NDA, the capping layer CPL may be omitted.

In an exemplary embodiment of the inventive concept, the organic light emitting diode OLED may further include a resonance structure for controlling a resonance distance of light generated from the light emitting layer EML. The resonance structure may be disposed between the first electrode AE and the second electrode CE and have a thickness that is determined according to a wavelength of the light generated from the light emitting layer EML.

Figure 4A:
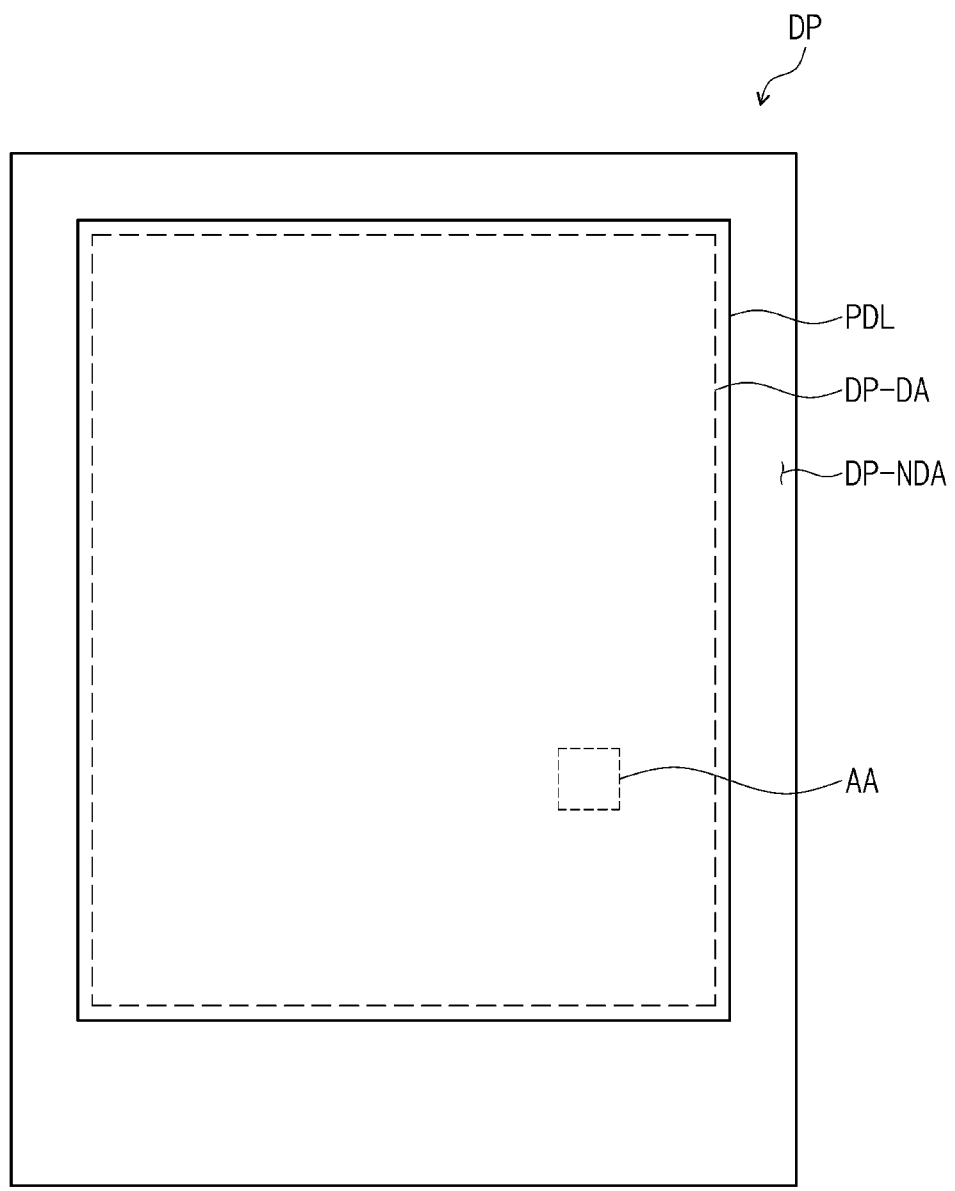
FIG. 4A is a plan view illustrating a display panel corresponding to one process of a method for manufacturing a display panel according to an exemplary embodiment of the inventive concept.
Figure 4B:
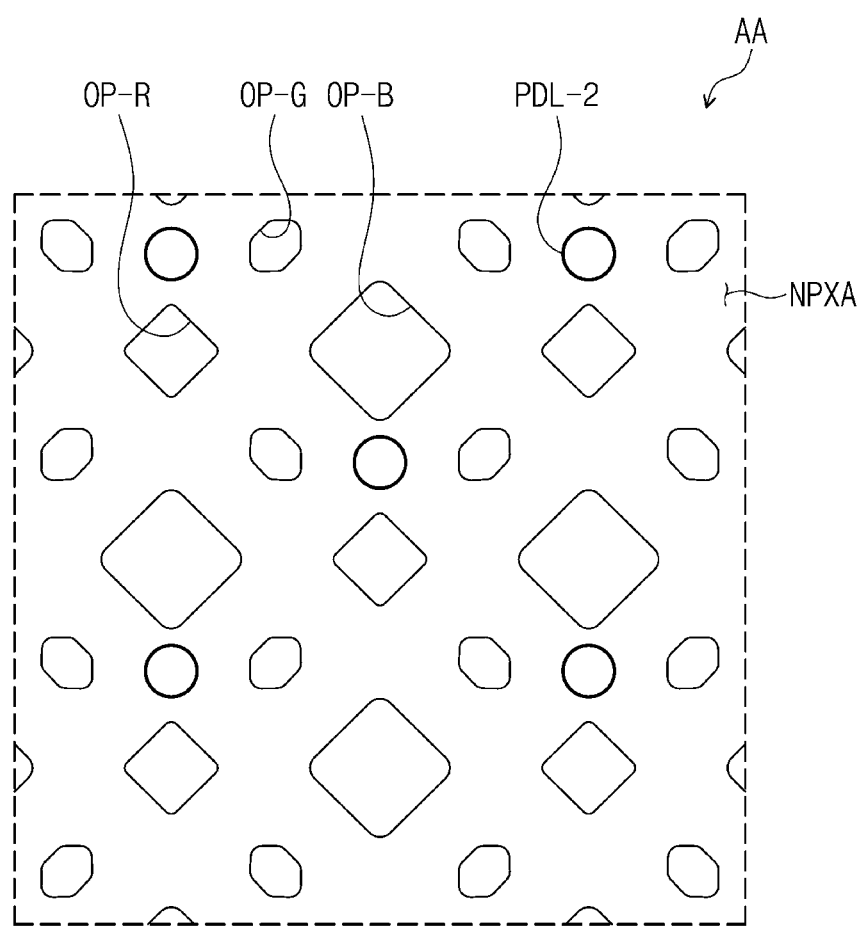
FIG. 4B is an enlarged plan view illustrating the display panel in FIG. 4A.
Figure 4C:
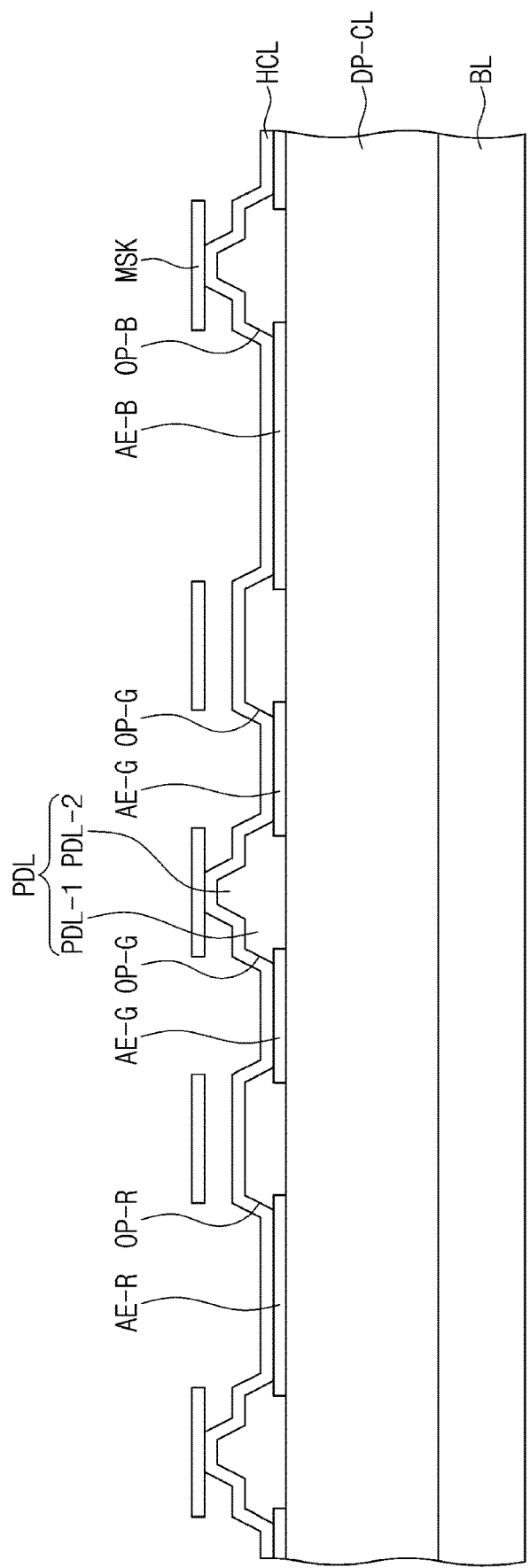
FIG. 4C is a cross-sectional view illustrating a display panel corresponding to one process of a method for manufacturing a display panel according to an exemplary embodiment of the inventive concept.

FIG. 4A is a plan view illustrating a display panel DP corresponding one process of a method of manufacturing the display panel DP according to an exemplary embodiment of the inventive concept. FIG. 4B is an enlarged plan view illustrating the display panel DP in FIG. 4A. FIG. 4C is a cross-sectional view illustrating the display panel DP corresponding one process of the method of manufacturing the display panel DP according to an exemplary embodiment of the inventive concept. Hereinafter, the pixel defining layer DPL, which is described in FIGS. 3D and 3E, will be described in more detail with reference to FIGS. 4A to 4C.

As illustrated in FIG. 4A, the pixel defining layer PDL may entirely overlap the display area DP-DA. According to an exemplary embodiment, an organic layer is formed on the intermediate organic layer 30, and then the formed organic layer is patterned through a photolithography process. Accordingly, the pixel defining layer PDL, which is divided into two portions and having a plurality of openings, may be formed.

FIG. 4B is an enlarged view illustrating an area AA of FIG. 4A. As illustrated in FIG. 4B, three kinds of openings may be formed in the pixel defining layer PDL. The three kinds of openings may include a first opening OP-G, a second opening OP-R, and a third opening OP-B, which are divided according to areas thereof. Each of the first opening OP-G, the second opening OP-R, and the third opening OP-B has an area in proportional to an emission area of the corresponding pixel.

The plurality of pixels in FIG. 3B may include a green pixel generating green light, a red pixel generating red light, and a blue pixel generating blue light. In this exemplary embodiment, each of the first opening OP-G, the second opening OP-R, and the third opening OP-B may correspond to the green pixel, the red pixel, and the blue pixel, respectively.

As illustrated in FIG. 4B, the second portion PDL-2 may be disposed on an area (hereinafter, referred to a spacer area) that is surrounded by the first opening OP-G, the second opening OP-R, and the third opening OP-B. A plurality of spacer areas may be defined in the pixel defining layer PDL, and the second portion PDL-2 may be disposed on a portion of the spacer areas.

The second portion PDL-2 may have various shapes. The second portion PDL-2 may have a circular shape and a rectangular shape. The second portion PDL-2 may have a length of one side or a length of a diameter of about 10 μm to about 25 The second portion PDL-2 having the above-described area is sufficient to serve as a spacer, which will be described later. The second portion PDL-2 may be spaced about 5 μm to about 10 μm from each of the first opening OP-G, the second opening OP-R, and the third opening OP-B.

As illustrated in FIG. 4C, the second portion PDL-2 supports a mask MSK. The mask MSK is used to deposit the light emitting layer EML in FIG. 3D. Substantially, the mask MSK contacts the hole control layer HCL disposed on the second portion PDL-2. The second portion PDL-2 support the mask MSK during the deposition process of the light emitting layer EML so that active areas of the hole control layer HCL, which correspond to a first-type opening OP-G, a second-type opening OP-R, and a third-type opening OP-B, are not in contact with the mask MSK. This is defined as a spacer function of the second portion PDL-2.

In FIG. 4C, a first-type first electrode AE-G, a second-type first electrode AE-R, and a third-type first electrode AE-B, which correspond to the first-type opening OP-G, the second-type opening OP-R, and the third-type opening OP-B, respectively, are illustrated. The first-type first electrode AE-G has a first area, the second-type first electrode AE-R has a second area that is greater than the first area, and the third-type first electrode AE-B has a third area that is greater than the second area. The area of each of the first-type first electrode AE-G, the second-type first electrode AE-R, and the third-type first electrode AE-B may determine an emission area of each of the corresponding pixels, and the emission area of each of the corresponding pixels may be proportional to the area of each of the first-type first electrode AE-G, the second-type first electrode AE-R, and the third-type first electrode AE-B.

FIGS. 5A to 5D are cross-sectional views illustrating a thin-film encapsulation layer TFE according to an exemplary embodiment of the inventive concept. The thin-film encapsulation layer TFE includes at least one insulation layer. The thin-film encapsulation layer TFE according to an embodiment of the inventive concept may include at least one inorganic layer (hereinafter, referred to as an encapsulation inorganic layer). The thin-film encapsulation layer TFE according to an exemplary embodiment of the inventive concept may include at least one organic layer (hereinafter, referred to as an encapsulation organic layer) and at least one encapsulation inorganic layer.

The encapsulation inorganic layer protects the display element layer DP-OLED from moisture/oxygen, and the encapsulation organic layer protects the display element layer DP-OLED from foreign substances such as dust particles. Although the encapsulation inorganic layer may include a silicon nitride layer, a silicon oxynitride layer, a silicon oxide layer, a titanium oxide layer, or an aluminum oxide layer, the inventive concept is not limited thereto. Although the encapsulation organic layer may include an acrylic-based organic layer, the inventive concept is not limited thereto.

Figure 5A:
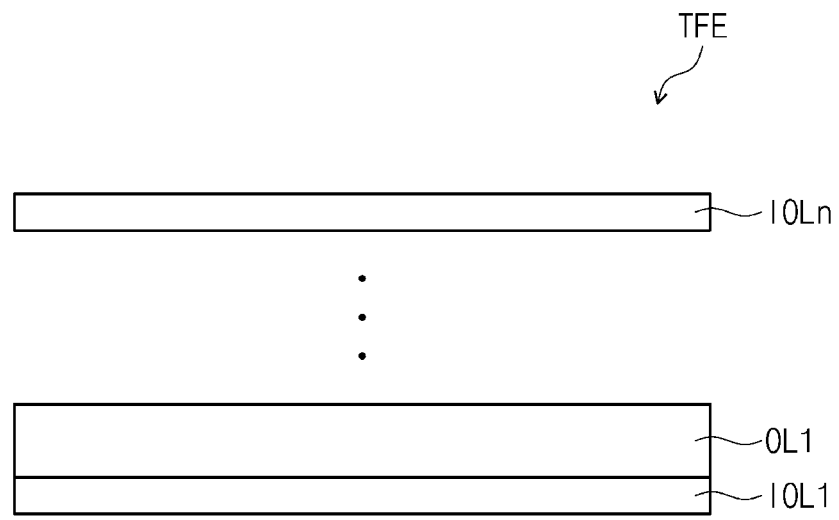
FIGS. 5A, 5B, 5C, and 5D are cross-sectional views illustrating a thin-film encapsulation layer according to an exemplary embodiment of the inventive concept.

As illustrated in FIG. 5A, the thin-film encapsulation layer TFE according to an exemplary embodiment of the inventive concept may include n (where, n is a natural number of two or more) encapsulation inorganic layers IOL1 to IOLn including a first encapsulation inorganic layer IOL1 contacting the second electrode CE (refer to FIG. 3D).

The thin-film encapsulation layer TFE may include n-1 encapsulation organic layers OL1, and the n-1 encapsulation organic layers OL1 may be arranged alternately with the n encapsulation inorganic layers IOL1 to IOLn. On average, each of the n-1 encapsulation organic layers OL1 has a thickness greater than that of each of the n encapsulation inorganic layers IOL1 to IOLn.

Each of the n encapsulation inorganic layers IOL1 to IOLn may have a single layer containing one material or double layers each containing a different material. The n-1 encapsulation organic layer OL1 may be formed by depositing organic monomers. Although the organic monomers may include, e.g., an acrylic-based monomer, the inventive concept is not limited thereto.

In an exemplary embodiment of the inventive concept, the thin-film encapsulation layer TFE may include a silicon oxynitride layer, an organic monomer layer, and a silicon nitride layer, which are sequentially laminated from the second electrode CE. Another inorganic layer may be disposed on the silicon nitride layer, and the silicon nitride layer may have multi-layers (e.g., two layers) that are deposited in conditions different from each other.

In an exemplary embodiment of the inventive concept, the thin-film encapsulation layer TFE may include a first encapsulation inorganic layer IOL1 and a second encapsulation inorganic layer IOL2.

Figure 5B:
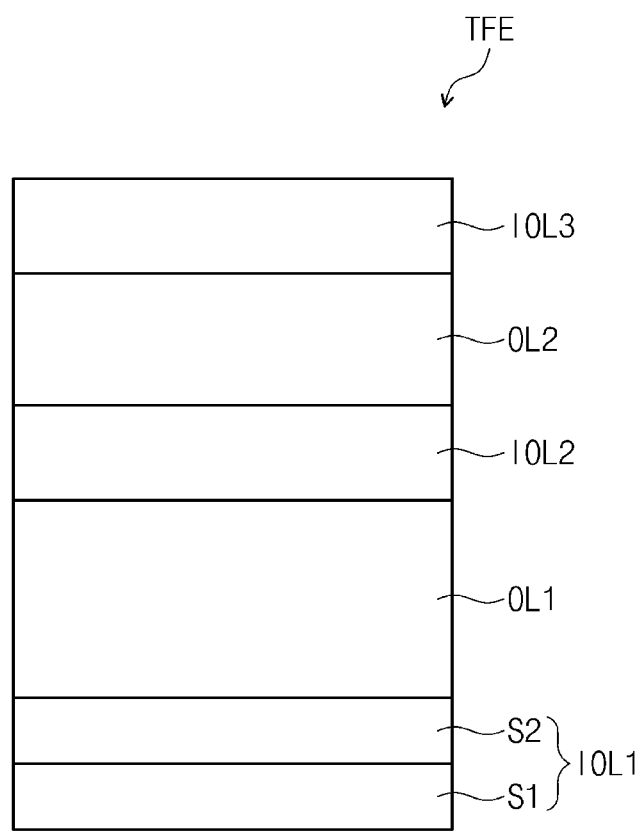

As illustrated in FIG. 5B, the thin-film encapsulation layer TFE may include a first encapsulation inorganic layer IOL1, a first encapsulation organic layer OL1, a second encapsulation inorganic layer IOL2, a second encapsulation organic layer OL2, and a third encapsulation inorganic layer IOL3, which are sequentially laminated.

The first encapsulation inorganic layer IOL1 may have a two layer structure. A first sub-layer S1 may be a lithium fluoride layer, and a second sub-layer S2 may be an aluminum oxide layer. The first encapsulation organic layer OL1 may be a first organic monomer layer, the second encapsulation inorganic layer IOL2 may be a first silicon nitride layer, the second encapsulation organic layer OL2 may be a second organic monomer layer, and the third encapsulation inorganic layer IOL3 may be a second silicon nitride layer.

Figure 5C:
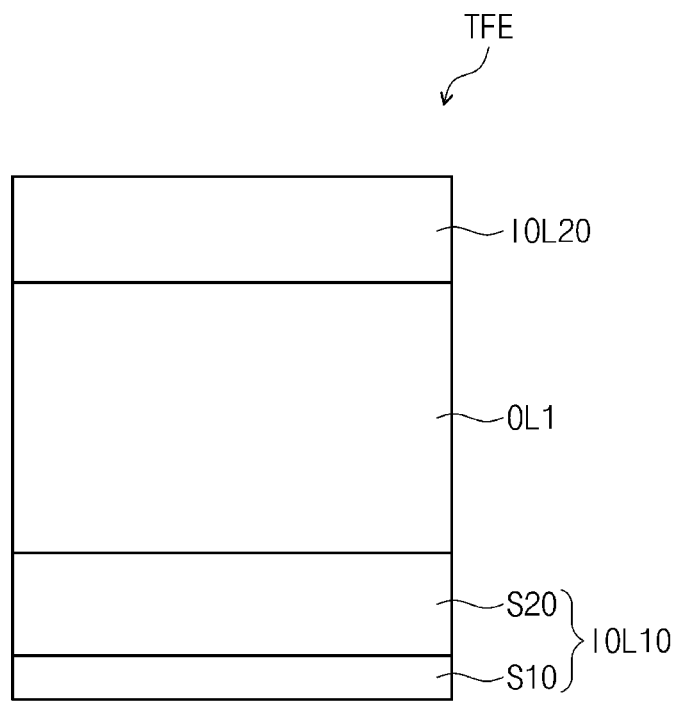

As illustrated in FIG. 5C, the thin-film encapsulation layer TFE may include a first encapsulation inorganic layer IOL10, a first encapsulation organic layer OL1, and a second encapsulation inorganic layer IOL20, which are sequentially laminated. The first encapsulation inorganic layer IOL10 may have a two layer structure.

A first sub-layer S10 may be a lithium fluoride layer, and a second sub-layer S20 may be a silicon oxynitride layer. The first encapsulation organic layer OL1 may include an acrylic-based monomer, and the second encapsulation inorganic layer IOL20 may be a silicon nitride layer. When the thin-film encapsulation layer TFE in FIG. 5C is applied to the display panel DP in FIG. 3D, the capping layer CPL may be a silicon nitride layer that is formed in a different deposition condition from that of the second encapsulation inorganic layer IOL20.

Figure 5D:
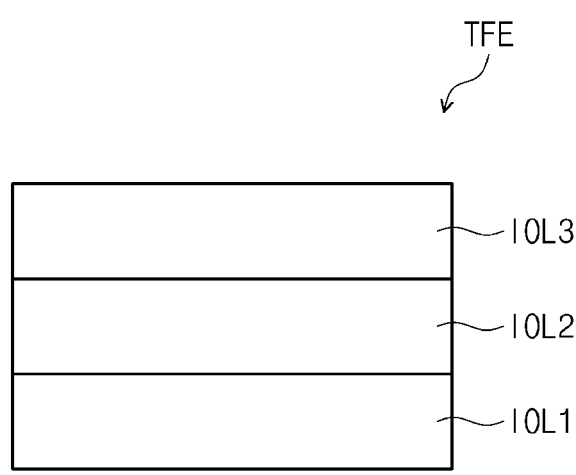

As illustrated in FIG. 5D, the thin-film encapsulation layer TFE may include a plurality of encapsulation inorganic layers that are sequentially laminated. The thin-film encapsulation layer TFE may include a first encapsulation inorganic layer IOL1, a second encapsulation inorganic layer IOL2, and a third encapsulation inorganic layer IOL3. At least one of the plurality of encapsulation inorganic layers may include a silicon nitride layer, a silicon oxynitride layer, a silicon oxide layer, a titanium oxide layer, or an aluminum oxide layer. For example, each of the first encapsulation inorganic layer IOL1 and the third encapsulation inorganic layer IOL3 may include a silicon nitride layer, a silicon oxynitride layer, a silicon oxide layer, a titanium oxide layer, or an aluminum oxide layer.

At least one of the plurality of encapsulation inorganic layers may be a hexamethyldisiloxane (HMDSO) layer. The hexamethyldisiloxane (HMDSO) layer may absorb a stress. The second encapsulation inorganic layer IOL2 may be a hexamethyldisiloxane (HMDSO) layer. The second encapsulation inorganic layer IOL2 may absorb a stress of each of the first encapsulation inorganic layer IOL1 and the third encapsulation inorganic layer IOL3. Accordingly, the thin-film encapsulation layer TFE may become more flexible.

When the thin-film encapsulation layer TFE includes only encapsulation inorganic layers, the thin-film encapsulation layer TFE may be formed through continuous deposition in one chamber, and thus a process for forming the thin-film encapsulation layer TFE is simplified. When the thin-film encapsulation layer TFE includes the encapsulation organic layer and the encapsulation inorganic layer, a process of being transferred between chambers is necessarily performed at least one time. When one of the encapsulation inorganic layers is a hexamethyldisiloxane (HMDSO) layer, the thin-film encapsulation layer TFE may have flexibility.

Figure 6A:
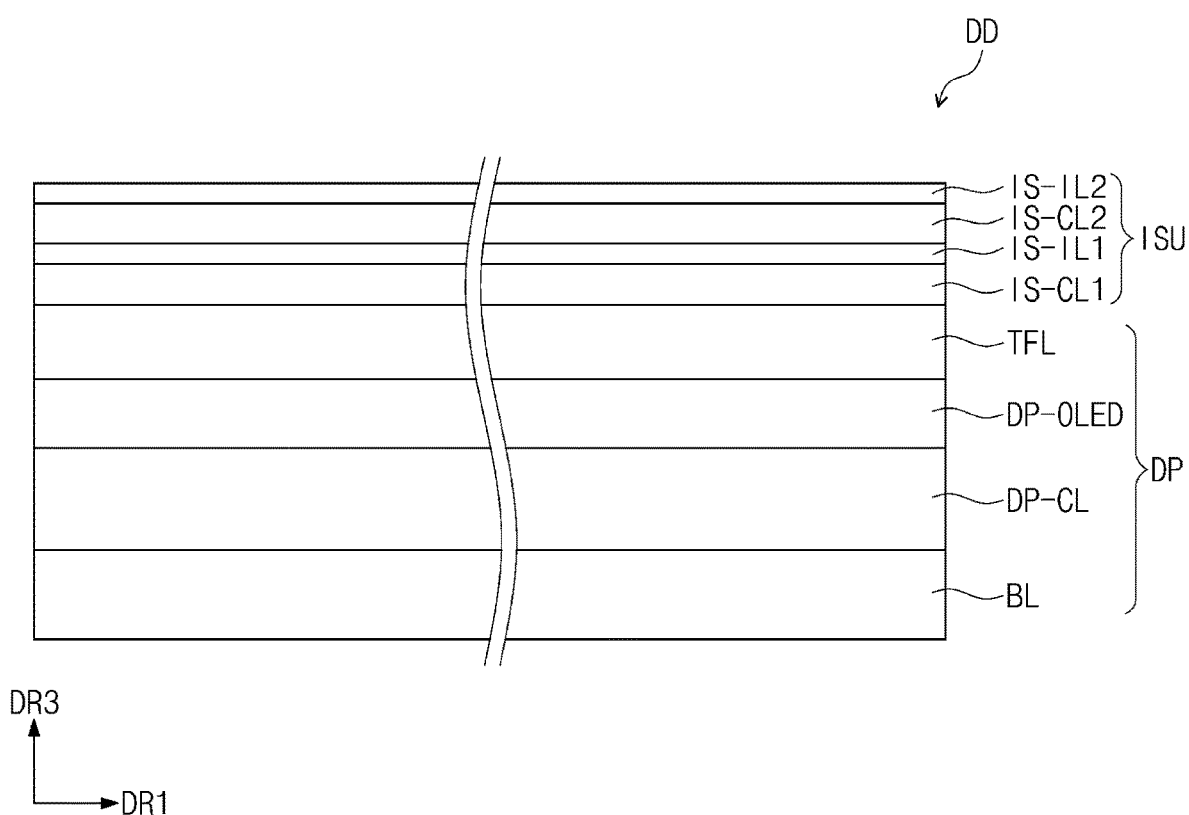
FIG. 6A is a cross-sectional view illustrating a display device according to an exemplary embodiment of the inventive concept.
Figure 6B:
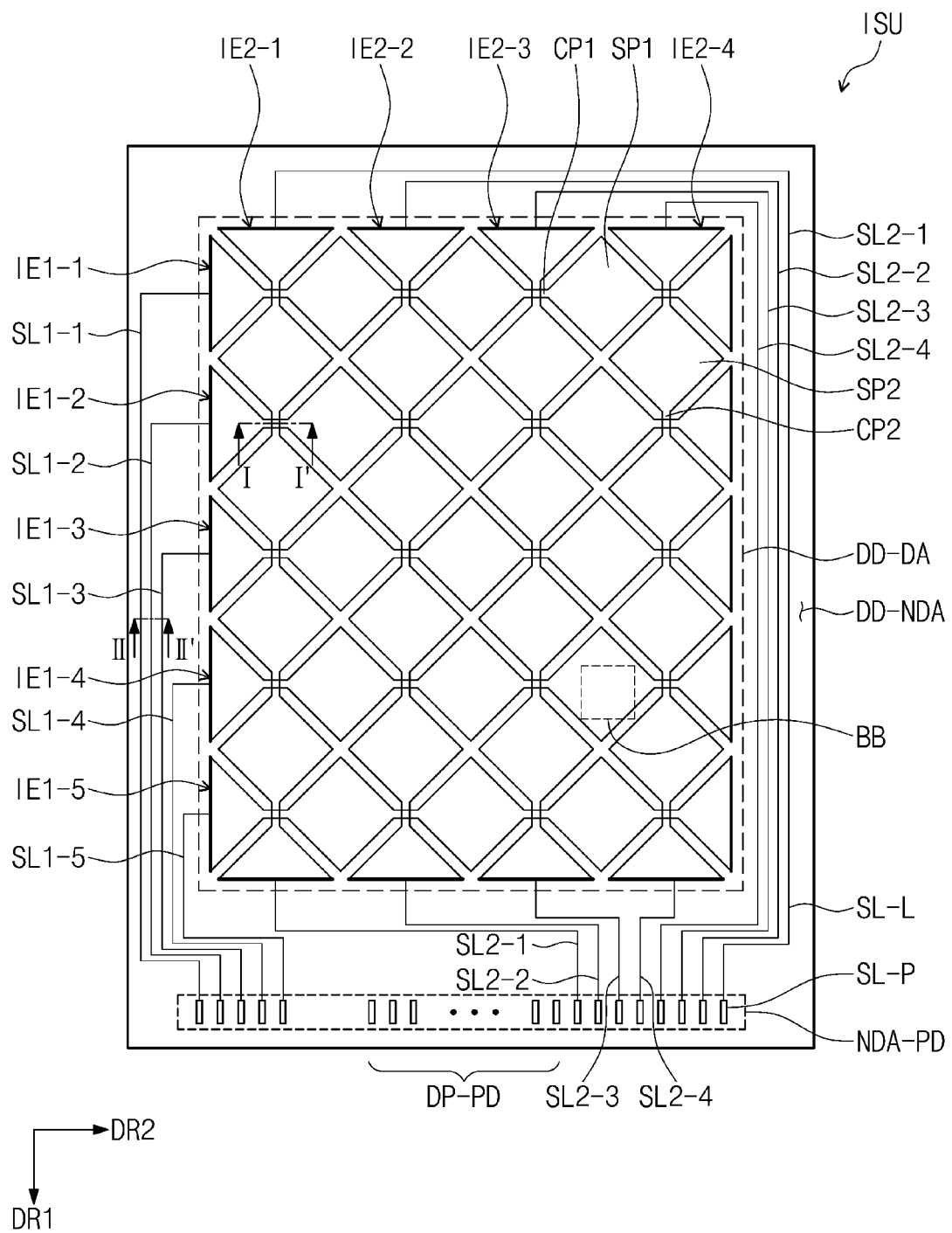
FIG. 6B is a plan view illustrating an input sensing unit according to an exemplary embodiment of the inventive concept.
Figure 6C:
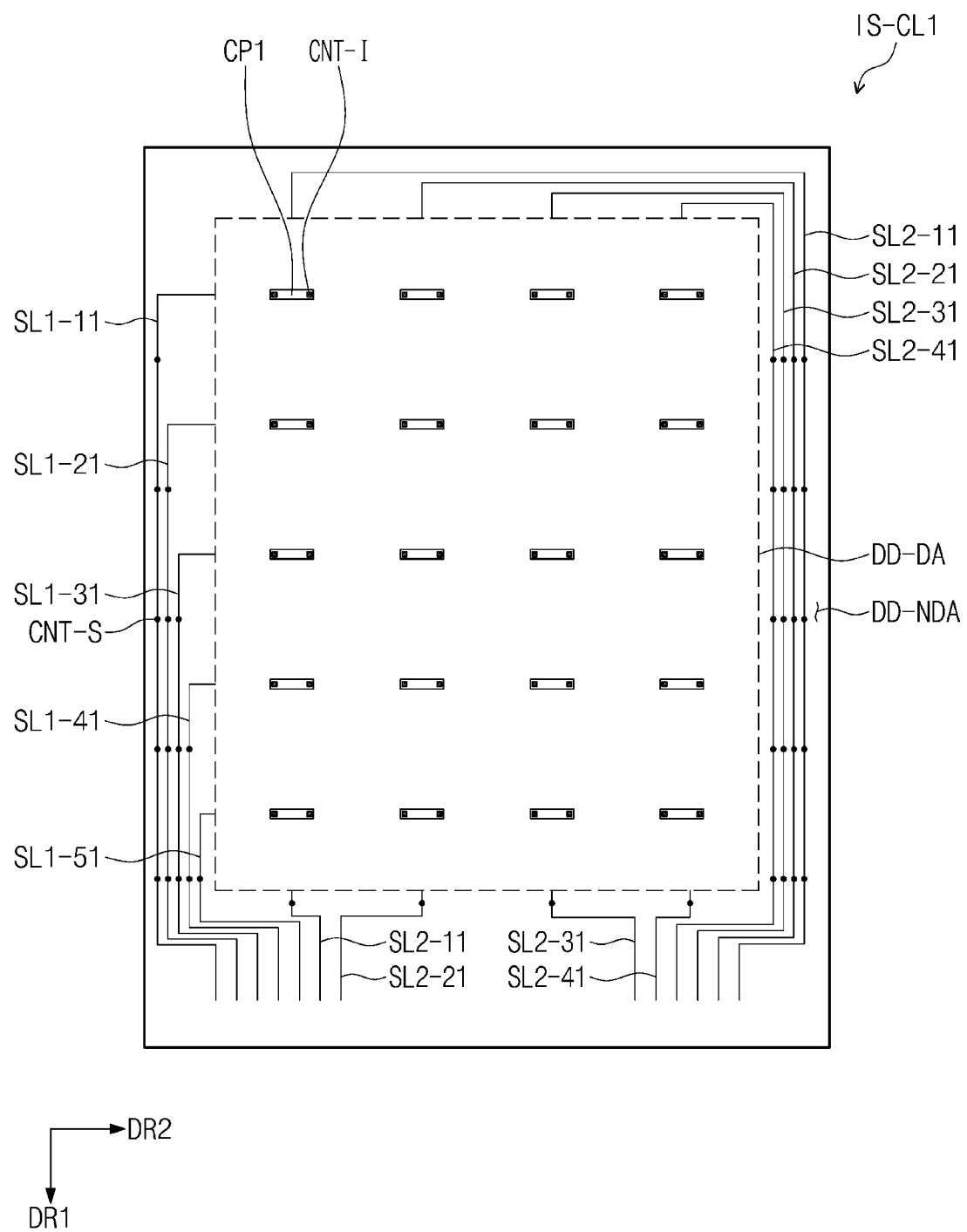
FIG. 6C is a plan view illustrating a first conductive layer of an input sensing unit according to an exemplary embodiment of the inventive concept.
Figure 6D:
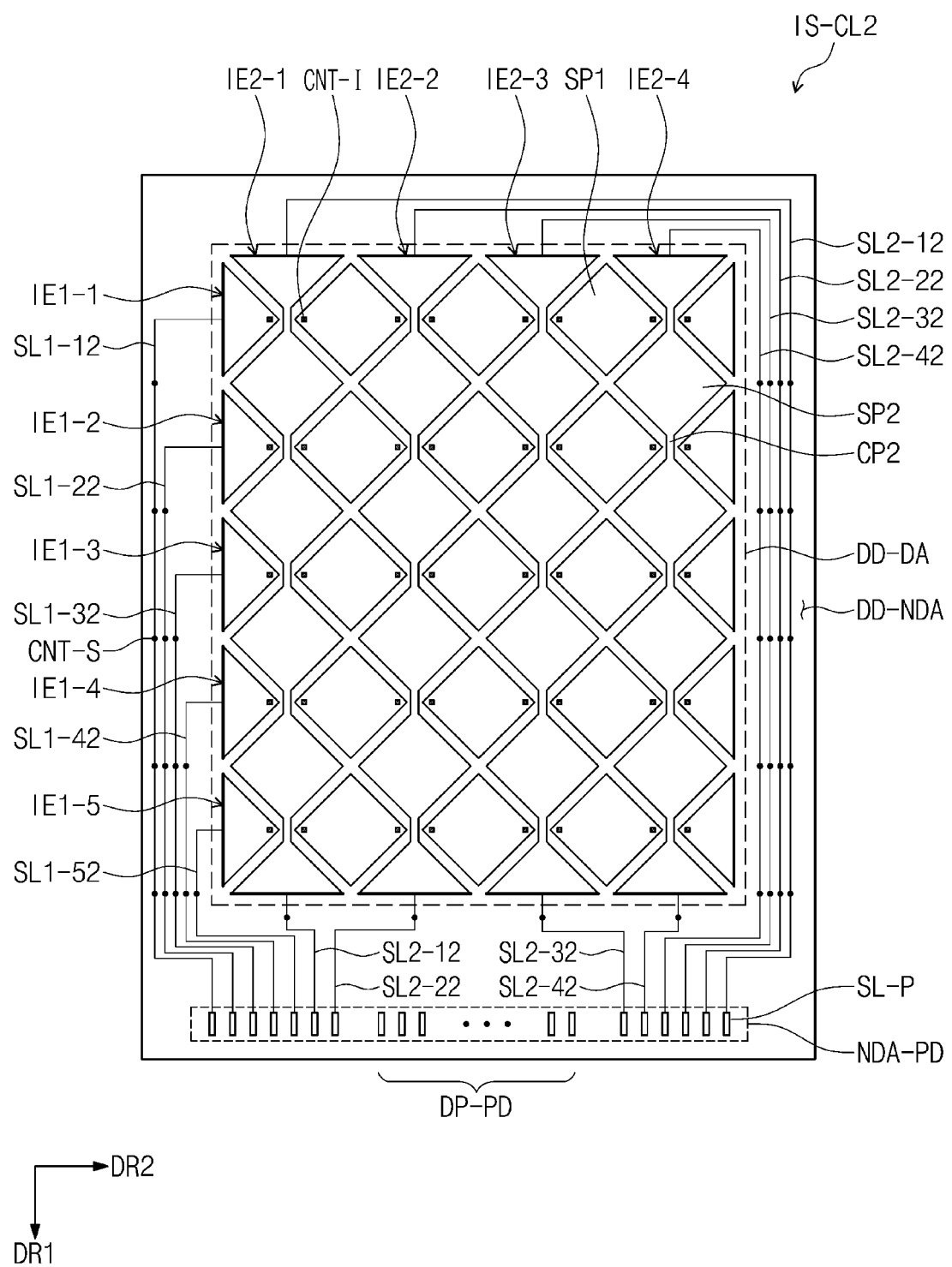
FIG. 6D is a plan view illustrating a second conductive layer of an input sensing unit according to an exemplary embodiment of the inventive concept.
Figure 6E:
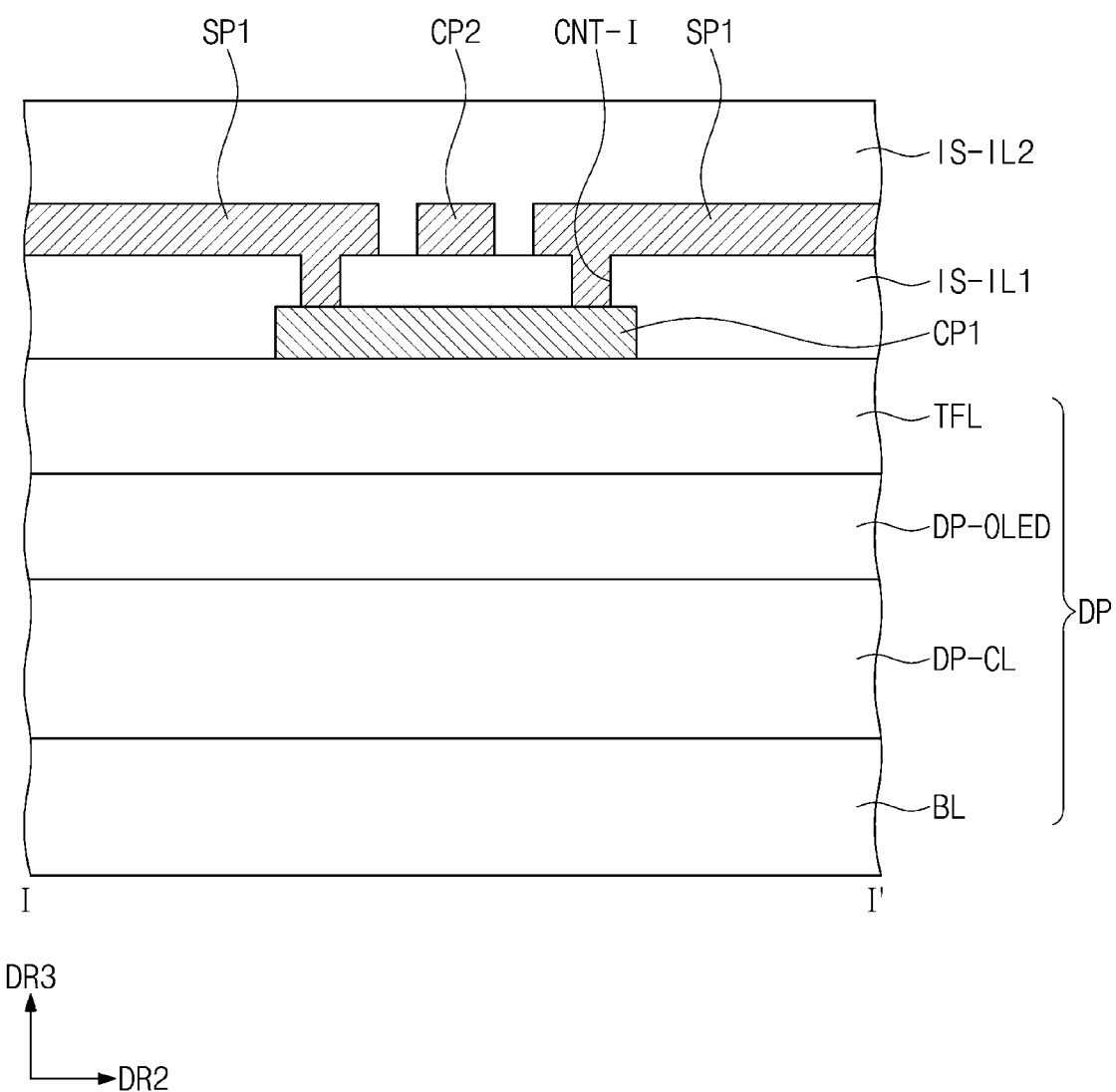
FIGS. 6E and 6F are partial cross-sectional views illustrating an input sensing unit according to an embodiment of the inventive concept.
Figure 6F:
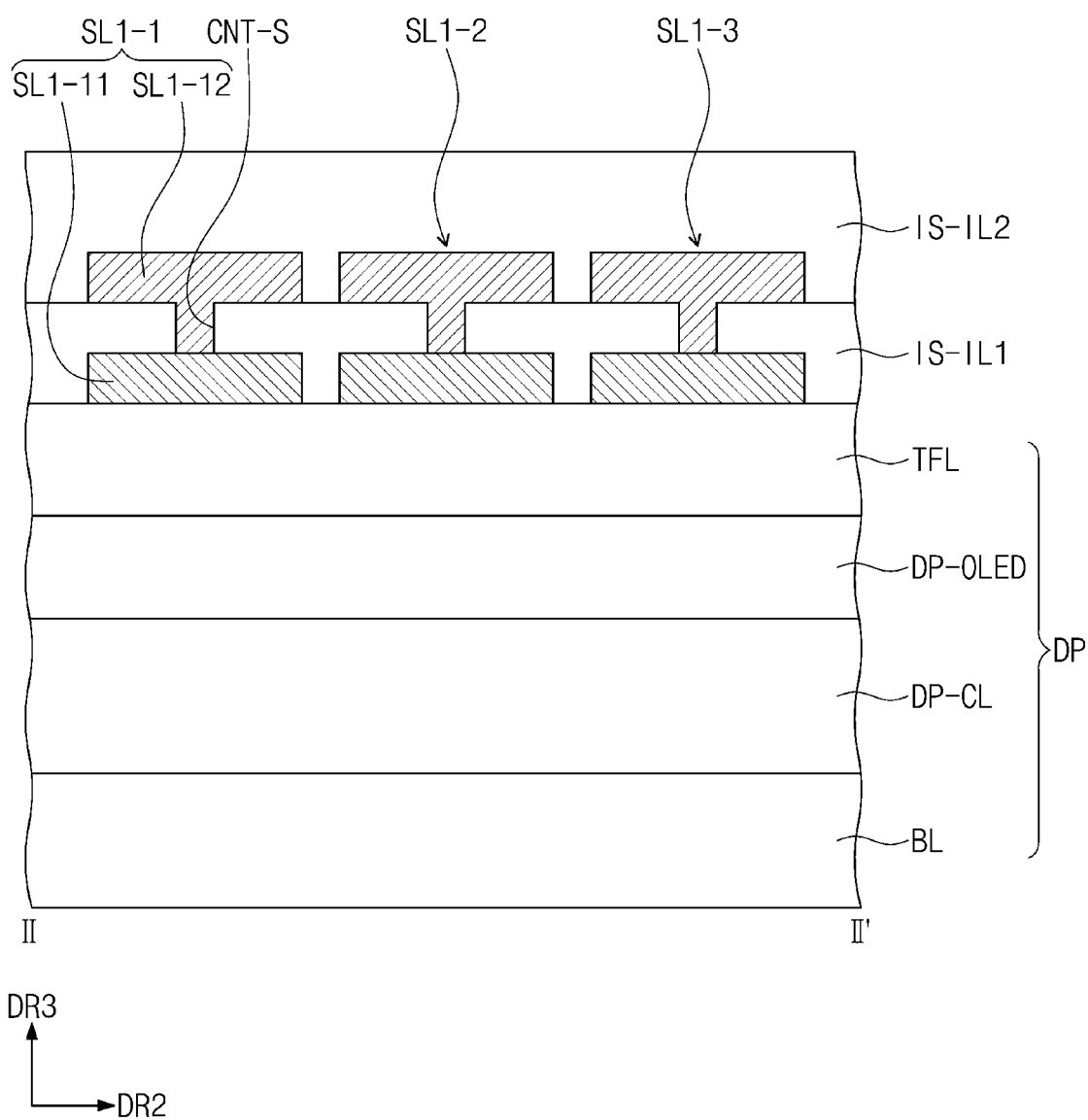

FIG. 6A is a cross-sectional view illustrating a display device DD according to an exemplary embodiment of the inventive concept. FIG. 6B is a plan view illustrating an input sensing unit ISU according to an exemplary embodiment of the inventive concept. FIG. 6C is a plan view illustrating a first conductive layer IS-CL1 of the input sensing unit ISU according to an exemplary embodiment of the inventive concept. FIG. 6D is a plan view illustrating a second conductive layer IS-CL2 of the input sensing unit ISU according to an exemplary embodiment of the inventive concept. FIGS. 6E and 6F are partial cross-sectional views illustrating an input sensing unit ISU according to an exemplary embodiment of the inventive concept.

In FIG. 6A, the display panel DP is simply illustrated in order to explain a lamination relationship of the input sensing unit ISU The anti-reflection unit and the window unit, which may be disposed on the input sensing unit ISU, are not illustrated. Like FIGS. 2A to 2D, the "layer"-type input sensing unit ISU is illustrated.

The input sensing unit ISU includes at least a sensing electrode. The input sensing unit ISU may further include a signal line connected to the sensing electrode and at least one insulation layer. The sensing electrode may contact the at least one insulation layer. The input sensing unit ISU may sense an external input, e.g., in a capacitive manner. The embodiment of the inventive concept is not particularly limited to the operation method of the input sensing unit ISU. For example, the input sensing unit ISU according to an exemplary embodiment of the inventive concept may sense an external input in an electromagnetic induction manner or a pressure sensing manner.

As illustrated in FIG. 6A, the input sensing unit ISU according to an exemplary embodiment of the inventive concept may include a first conductive layer IS-CL1, a first insulation layer IS-ILL a second conductive layer IS-CL2, and a second insulation layer IS-IL2. Each of the first conductive layer IS-CL1 and the second conductive layer IS-CL2 may have a single layer structure or a multi-layer structure laminated in the third direction DR3. The conductive layer having the single layer structure may include a metal layer or a transparent conductive layer. The metal layer may include molybdenum, silver, titanium, copper, aluminum, and an alloy thereof. The transparent conductive layer may include a transparent conductive oxide such as an indium tin oxide (ITO), an indium zinc oxide (IZO), a zinc oxide (ZnO), an indium tin zinc oxide (ITZO). In addition, the transparent conductive layer may include a conductive polymer such as PEDOT, a metal nano-wire, and graphene.

The conductive layer having the multi-layer structure may include multi-layers of metal layers. The multi-layers of metal layers may have, e.g., a three layer structure of titanium, aluminum, and titanium. The conductive layer having the multi-layer structure may include at least one metal layer and at least one transparent conductive layer.

Each of the first and second conductive layers IS-CL1 and IS-CL2 may include a plurality of patterns. Hereinafter, the first conductive layer IS-CL1 includes first conductive patterns, and the second conducive layer IS-CL2 includes second conductive patterns. Each of the first conductive patterns and the second conductive patterns may include sensing electrodes and signal lines.

The sensing electrodes may have a lamination structure and a material, which are determined in consideration of sensitivity. RC delay may affect the sensitivity, and the sensing electrodes including the metal layer may have a decreased RC value because the sensing electrodes have resistance less than that of the transparent conductive layer. Accordingly, a time of charging a capacitor provided between the sensing electrodes decreases. The sensing electrodes including the transparent conductive layer are not seen to a user in comparison with the metal layer, and an input area increases to increase capacitance.

The sensing electrodes including the metal layer may have a mesh shape in order to prevent the sensing electrodes from being seen to the user as described later. An upper insulation layer TFL may have a thickness that is adjustable so that noises generated by components of the display element layer DP-OLED do not affect the input sensing unit ISU. Each of the first insulation layer IS-IL1 and the second insulation layer IS-IL2 may have a single layer or multilayer structure. Each of the first insulation layer IS-IL1 and the second insulation layer IS-IL2 may contain an inorganic material, an organic material, or a composite material.

At least one of the first insulation layer IS-IL1 and the second insulation layer IS-IL2 may include an inorganic layer. The inorganic layer may include at least one of an aluminum oxide, a titanium oxide, a silicon oxide, a silicon oxynitride, a zirconium oxide, and a hafnium oxide.

At least one of the first insulation layer IS-IL1 and the second insulation layer IS-IL2 may include an inorganic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

As illustrated in FIG. 6B, the input sensing unit ISU may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4. Although not shown, the input sensing unit ISU may further include an optical dummy electrode disposed on a boundary area between the first sensing electrodes IE1-1 to IE1-5 and the second sensing electrodes IE2-1 to IE2-4.

The first sensing electrodes IE1-1 to IE1-5 and the second sensing electrodes IE2-1 to IE2-4 cross each other. The first sensing electrodes IE1-1 to IE1-5 are arranged in the first direction DR1 and extend in the second direction DR2. An external input may be sensed by a mutual cap method and/or a self cap method. A coordinate of an external input may be calculated in the mutual cap method during a first section and then re-calculated in the self cap method during a second section.

Each of the first sensing electrodes IE1-1 to IE1-5 includes first sensor parts SP1 and first connecting parts CP1. Each of the second sensing electrodes IE2-1 to IE2-4 includes second sensor parts SP2 and second connecting parts CP2. Each of two first sensor parts, which are disposed on both ends of the first electrode, of the first sensor parts SP1 may have a size less than that of the first sensor part disposed on a central area, e.g. a ½ size of that of the first sensor part disposed on a central area. Each of two first sensor parts, which are disposed on both ends of the second electrode, of the second sensor parts SP2 may have a size less than that of the second sensor part disposed on a central area, e.g. a ½ size of that of the second sensor part disposed on a central area.

Although the first sensing electrodes IE1-1 to IE1-5 and the second sensing electrodes IE2-1 to IE2-4 according to an exemplary embodiment are illustrated in FIG. 6B, the inventive concept is not limited to the shape thereof. In an embodiment of the inventive concept, each of the first sensing electrodes IE1-1 to IE1-5 and the second sensing electrodes IE2-1 to IE2-4 may have a shape (e.g., a bar shape) in which the sensor part and the connecting part are not distinguished. Although the first and second sensor parts SP1 and SP2 each having a rhombus shape are exemplarily illustrated, the inventive concept is not limited thereto. For example, each of the first and second sensor parts SP1 and SP2 may have a different polygonal shape.

The first sensor parts SP1 are arranged in the second direction DR2 in one first sensing electrode, and the second sensor parts SP2 are arranged in the first direction DR1 in one second sensing electrode. Each of the first connecting parts CP1 connects the adjacent first sensor parts SP1 to each other, and each of the second connecting parts CP2 connects the adjacent second sensor parts SP2 to each other.

Each of the first signal lines SL1-1 to SL1-5 is connected to one end of each of the first sensing electrodes IE1-1 to IE1-5. Each of the second signal lines SL2-1 to SL2-4 is connected to both ends of each of the second sensing electrodes IE2-1 to IE2-4. In an exemplary embodiment of the inventive concept, each of the first signal lines SL1-1 to SL1-5 may be connected to both ends of each of the first sensing electrodes IE1-1 to IE1-5. In an exemplary embodiment of the inventive concept, each of the second signal lines SL2-1 to SL2-4 may be connected to only one end of each of the second sensing electrodes IE2-1 to IE2-4.

According to this exemplary embodiment, sensitivity may be improved for the input sensing unit ISU including the second signal lines SL2-1 to SL2-4, which are connected to only one end of each of the second sensing electrodes IE2-1 to IE2-4, respectively. Since the second sensing electrodes IE2-1 to IE2-4 are greater in length than the first sensing electrodes IE1-1 to IE1-5, voltage drop of a detection signal (or transmission signal) may be generated, and accordingly, sensitivity may be reduced. According to this exemplary embodiment, since the detection signal (or transmission signal) is supplied through the second signal lines SL2-1 to SL2-4 connected to both ends of the second sensing electrodes IE2-1 to IE2-4, the voltage drop of the detection signal (or transmission signal) may be prevented to prevent the reduction in sensitivity.

The first signal lines SL1-1 to SL1-5 and the second signal lines SL2-1 to SL2-4 may include a line part SL-L and a pad part SL-P. The pad part SL-P may be arranged on a pad area NDA-PA. The input sensing unit ISU may include signal pads DP-PD. The signal pads DP-PD may be arranged on the pad area NDA-PD. The signal pads DP-PD may overlap and be connected to the pad parts of the signal lines SGL in FIG. 3B In an exemplary embodiment of the inventive concept, the first signal lines SL1-1 to SL1-5 and the second signal lines SL2-1 to SL2-4 may be replaced by a circuit board that is separately manufactured and then coupled.

As illustrated in FIG. 6C, a first conductive layer IS-CL1 includes first connecting parts CP1. Also, the first conductive layer IS-CL1 may include first line parts SL1-11 to SL1-51 of first signal lines SL1-1 to SL1-5 and first line parts SL2-11 to SL2-41 of second signal lines SL2-1 to SL2-4.

The first connecting parts CP1, the first line parts SL1-11 to SL1-51 of the first signal lines SL1-1 to SL1-5, and the first line parts SL2-11 to SL2-41 of the second signal lines SL2-1 to SL2-4 may be formed through the same process. The first connecting parts CP1, the first line parts SL1-11 to SL1-51 of the first signal lines SL1-1 to SL1-5, and the first line parts SL2-11 to SL2-41 of the second signal lines SL2-1 to SL2-4 may include the same material and have the same lamination structure. Alternatively, the first connecting parts CP1 may be formed through a process different from that of the first line parts SL1-11 to SL1-51 of the first signal lines SL1-1 to SL1-5 and the first line parts SL2-11 to SL2-41 of the second signal lines SL2-1 to SL2-4. The first connecting parts CP1 may have the same lamination structure as that of the first line parts SL1-11 to SL1-51 of the first signal lines SL1-1 to SL1-5 and the first line parts SL2-11 to SL2-41 of the second signal lines SL2-1 to SL2-4 while having a lamination structure different therefrom.

In an exemplary embodiment of the inventive concept, the first conductive layer IS-CL1 may include second connecting parts CP2 (refer to FIG. 6A). Here, the first connecting parts CP1 are formed from the first conductive layer IS-CL1. Accordingly, the first sensing electrodes IE1-1 to IE1-5 may have a single body.

Although not shown in FIG. 6C, the first insulation layer IS-IL1 covers at least the first connecting parts CP1. In this exemplary embodiment, the first insulation layer IS-IL1 may overlap the display area DD-DA and at least a portion of the non-display area DD-NDA. The first insulation layer IS-IL1 may cover the first line parts SL1-11 to SL1-51 of the first signal lines SL1-1 to SL1-5 and the first line parts SL2-11 to SL2-41 of the second signal lines SL2-1 to SL2-4.

In this exemplary embodiment, the first insulation layer IS-IL1 may overlap the display area DD-DA and the pad area NDA-PD. The first insulation layer IS-IL1 may entirely overlap the display area DD-DA and the non-display area DD-NDA. In the first insulation layer IS-IL1, first connecting contact holes CNT-1, which partially exposes the first connecting parts CP1, the first line parts SL1-11 to SL1-51 of the first signal lines SL1-1 to SL1-5, and second connecting contact holes CNT-S, which partially exposes the first line parts SL2-11 to SL2-41 of the second signal lines SL2-1 to SL2-4, may be defined.

As illustrated in FIG. 6D, the second conductive layer IS-CL2 includes first sensor parts SP1, second sensor parts SP2, and second connecting parts CP2. The second sensing electrodes IE2-1 to IE2-4 may have a single body. The first sensor parts SP1 are spaced apart from the second sensing electrodes IE2-1 to IE2-4.

The second conductive layer IS-CL2 may include second line parts SL1-12 to SL1-52 of first signal lines SL1-1 to SL1-5, pad parts SL-P of the first signal lines SL1-1 to SL1-5, second line parts SL2-12 to SL2-42 of second signal lines SL2-1 to SL2-4, and pad parts SL-P of the second signal lines SL2-1 to SL2-4. The second conductive layer IS-CL2 may include signal pads DP-PD.

The first sensor parts SP1, the second sensor parts SP2, and the second connecting parts CP2 may be formed through the same process. The first sensor parts SP1, the second sensor parts SP2, and the second connecting parts CP2 may contain the same material and have the same structure as each other. The second line parts SL1-12 to SL1-52 of the first signal lines SL1-1 to SL1-5, the pad parts SL-P of the first signal lines SL1-1 to SL1-5, the second line parts SL2-12 to SL2-42 of the second signal lines SL2-1 to SL2-4, the pad parts SL-P of the second signal lines SL2-1 to SL2-4, and the signal pads DP-PD may be formed through the same process as or a different process from that of the first sensor parts SP1, the second sensor parts SP2, and the second connecting parts CP2.

Although not shown in FIG. 6D, the second insulation layer IS-IL2 may overlap the display area DD-DA and at least a portion of the non-display area DD-NDA. In this exemplary embodiment, the second insulation layer IS-IL2 may expose the pad area NDA-PD.

As illustrated in FIG. 6E, first sensor parts SP1 are electrically connected to a first connecting part CP1 through first connecting contact holes CNT-1. The first connecting part CP1 may contain a material having resistance less than that of the first sensor parts SP1.

As the first connecting part CP1 crosses the second connecting part CP2, the first connecting part CP1 desirably has a minimized width (which is measured on a plane) so as to reduce influence of parasitic capacitance. The first connecting part CP1 may contain a material having low resistance in order to improve the sensitivity, and may contain the same metal material as the first line parts SL1-11 to SL1-51 of the first signal lines SL1-1 to SL1-5.

In this exemplary embodiment, the first insulation layer IS-IL1 may be a polymer layer, e.g., an acrylic polymer layer. Also, the second insulation layer IS-IL2 may be a polymer layer, e.g., an acrylic polymer layer Although the input sensing unit ISU is disposed directly on the display panel DP, the polymer layer may improve flexibility of the display device DD. FIG. 6F exemplarily illustrates three first signal lines SL1-1 to SL1-3 of the first signal lines SL1-1 to SL1-5. Referring to first signal line SL1-1, a first line part SL1-11 and a second line part SL1-12 are electrically connected through second connecting contact holes CNT-S. Accordingly, resistance of the first signal line SL1-1 may be reduced.

In an exemplary embodiment of the inventive concept, one of the first line part SL1-11 and the second line part SL1-12 may be omitted. One of the first line part and the second line part of the second signal lines SL2-1 to SL2-4 may be omitted.

A lamination order of components of the input sensing unit ISU described with reference to FIGS. 6C to 6F may be changed. In an exemplary embodiment of the inventive concept, the first sensor parts SP1 and the second connecting part CP2 may be disposed directly on the upper insulation layer TFL. The first insulation layer IS-IL1 covering the first sensor parts SP1 and the second connecting part CP2 is disposed on the upper insulation layer TFL. The first connecting part CP1 disposed on the first insulation layer IS-IL1 is electrically connected to the first sensor parts SP1 through the first connecting contact holes CNT-1.

Figure 7A:
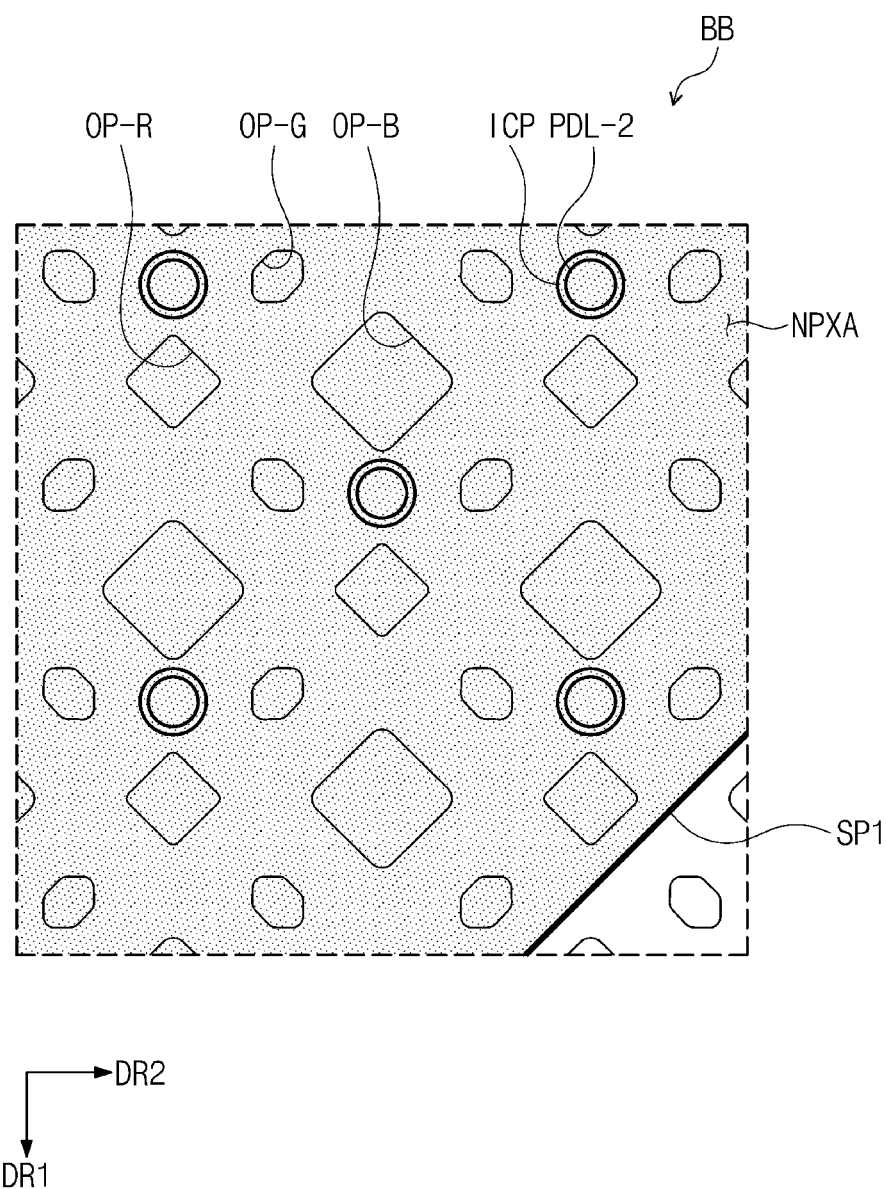
FIG. 7A is an enlarged plan view illustrating an input sensing unit according to an exemplary embodiment of the inventive concept.
Figure 7B:
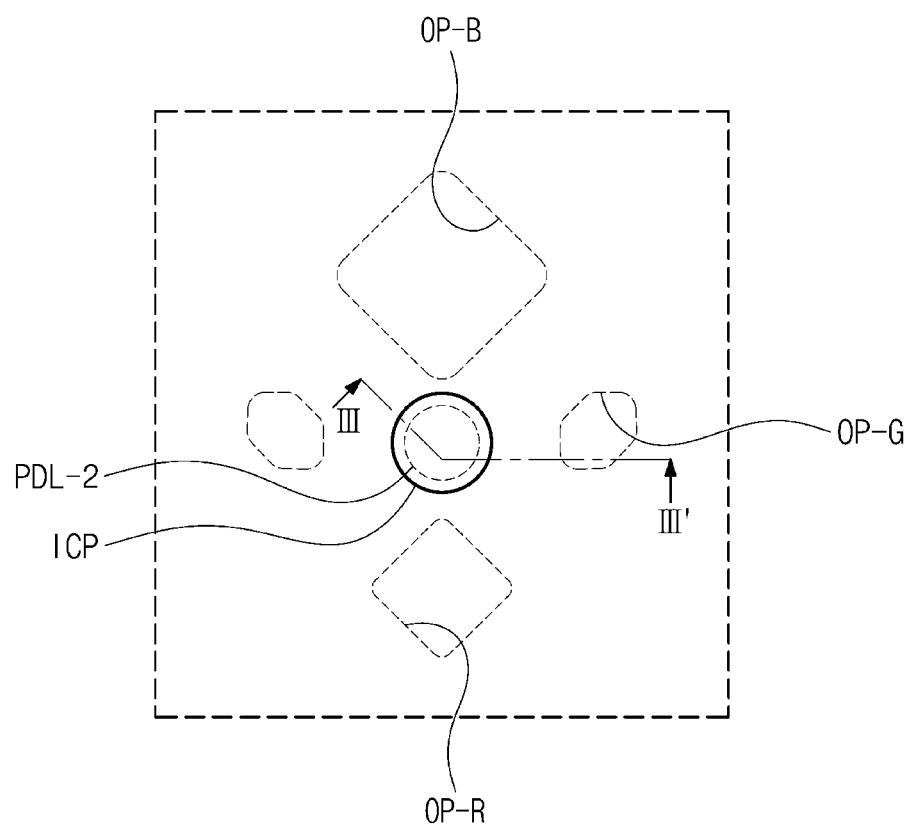
FIG. 7B is an enlarged plan view illustrating a portion of FIG. 7A.

FIG. 7A is an enlarged plan view illustrating an input sensing unit ISU according to an exemplary embodiment of the inventive concept. FIG. 7B is an enlarged plan view illustrating a portion of FIG. 7A. FIGS. 7C and 7D are enlarged cross-sectional views illustrating a display device according to an exemplary embodiment of the inventive concept. The first portion PDL-1 and the second portion DPL-2 of the pixel defining layer PDL will be described with reference to FIG. 3D.

FIG. 7A is an enlarged view illustrating an area BB in FIG. 6B. The area BB in FIG. 6B overlaps the area AA in FIG. 4A. In this exemplary embodiment, the first sensor part SP1 including the transparent conductive layer is exemplarily illustrated. The anti-reflection unit and the window unit, which may be disposed on the input sensing unit ISU, are not illustrated FIG. 7C, and components disposed below the input sensing unit ISU are not illustrated in FIG. 7D.

As illustrated in FIGS. 7A to 7D, the display panel DP may include an insulation structure disposed on the insulation layer TFL. In this exemplary embodiment, the insulation structure may include a plurality of insulation patterns ICP. The insulation patterns ICP partially overlap the pixel defining layer PDL. One insulation pattern ICP may correspond to the second portion PDL-2 of one pixel defining layer PDL.

As illustrated in FIG. 7B, the insulation pattern ICP covers the second portion PDL2 on a plane. The second portion PDL-2 desirably overlaps at least about 90% of the insulation pattern ICP. The second portion PDL-2 may be disposed inside the insulation pattern ICP on a plane. Desirably, the second portion PLD-2 substantially fully overlaps the insulation pattern ICP. The wording of "substantially fully overlaps" includes a range of a process tolerance that is generated while the insulation pattern ICP is formed on the second portion PDL-2.

The insulation pattern ICP may contain an organic material. The insulation pattern ICP may contain the same material as the pixel defining layer PDL. The second portion PDL-2 may contain an inorganic material.

As illustrated in FIG. 7C, the insulation pattern ICP compensates a distance between the second electrode CE and the sensing electrode (first sensor part SP1 in FIG. 7C), which are not uniform due to the second portion PDL-2. When the insulation pattern ICP is not provided, a distance between a partial area (hereinafter, referred to as a first area) of the second electrode CE, which overlaps the second portion PDL-2, and the first sensor part SP1 may be less than a distance between a partial area (hereinafter, referred to as a second area) of the second electrode CE, which does not overlap the second portion PDL-2, and the first sensor part SP1. Non-uniformity of the distance between the second electrode CE and the first sensor part SP1 may generate a noise in the input sensing unit ISU.

According to this exemplary embodiment, a distance D1 between the first area SP1-1 of the first sensor part SP1, which overlaps the insulation pattern ICP and a base insulation layer, i.e., an intermediate organic layer 30, is greater than a distance D2 between the second area SP1-2 of the first sensor part SP1, which does not overlap the insulation pattern ICP, and the intermediate organic layer 30. The distance between the first area SP1-1 of the first sensor part SP1 and the second electrode CE may be substantially the same as the distance between the second area SP1-2 of the first sensor part SP1 and the second electrode CE. The reason is that a thickness TH2-1 of the second portion PDL-2 is substantially the same as a thickness TH3 of the insulation pattern ICP. A thickness TH2 of the second portion PDL-20 and a thickness TH3 of the insulation pattern ICP may be measured on one line parallel to the third direction DR3 and then be compared.

As described above, the first area SP1-1 and the second area SP1-2 of the first sensor part SP1 are uneven to form a stepped portion. The stepped shape of the first sensor part SP1 is generated by the insulation pattern ICP. As illustrated in FIG. 7D, a distance D3 between the first area SP1-1 of the first sensor part SP1 and a top surface of the window panel WP may be less than a distance D4 between the second area SP1-2 of the first sensor part SP1, which non-overlaps the insulation pattern ICP, and the top surface of the window panel WP. The reason for this is that a portion of the window panel WP, which covers the first area SP1-1 and the second area SP1-2, is flat.

Figure 8A:
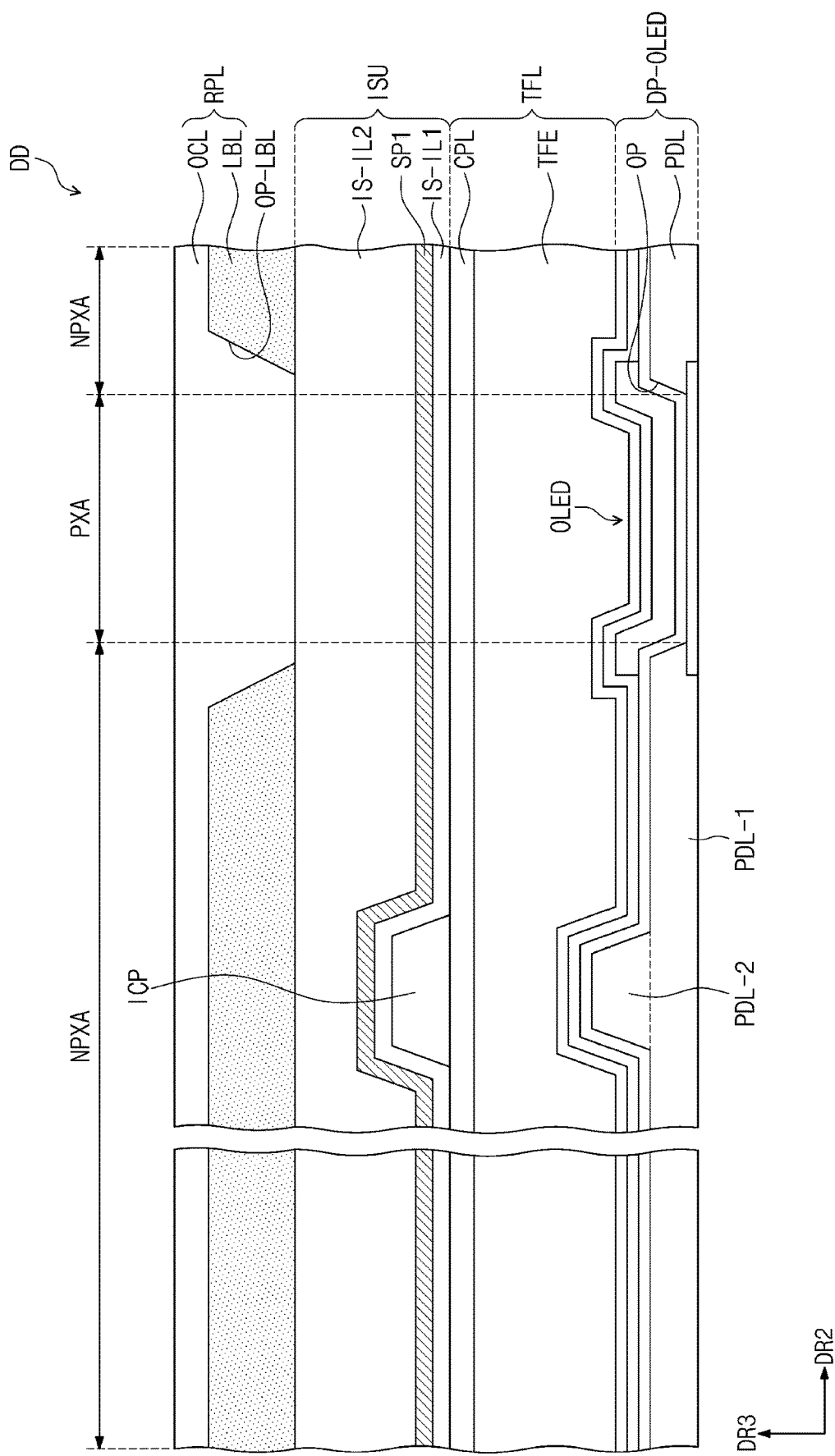
FIGS. 8A and 8B are enlarged cross-sectional views illustrating a display device according to an exemplary embodiment of the inventive concept.
Figure 8B:
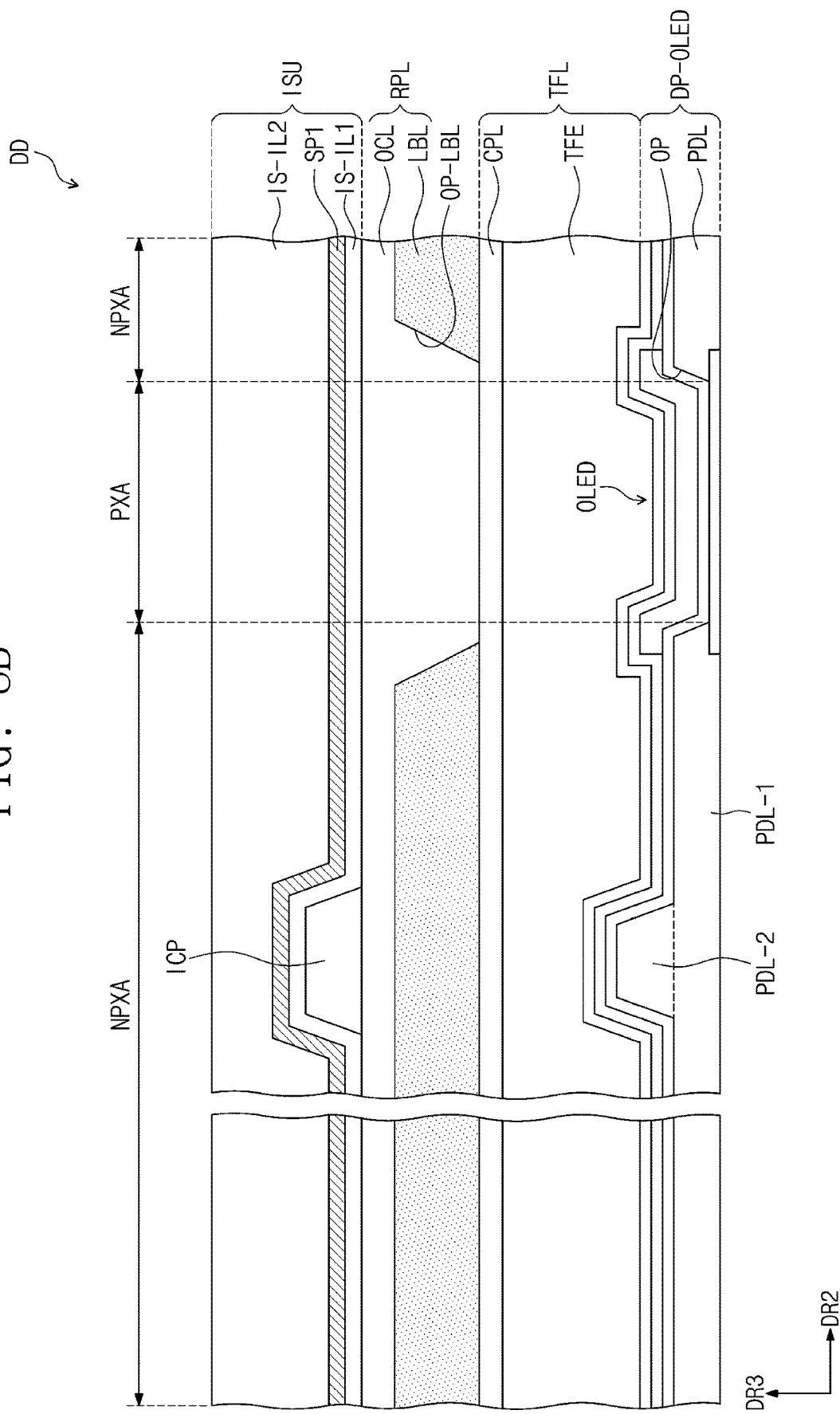

FIGS. 8A and 8B are enlarged cross-sectional views illustrating a display device DD according to an exemplary embodiment of the inventive concept. Hereinafter, a detailed description regarding the same components as those described with reference to FIGS. 1 to 7D will be omitted. FIGS. 8A and 8B illustrate a cross-section corresponding to FIG. 7C, and a portion below the display element layer DP-OLED is not illustrated.

FIG. 8A is an enlarged view illustrating the display device DD corresponding to FIG. 2C, and FIG. 8B is an enlarged view illustrating the display device DD corresponding to FIG. 2D. The display device DD in FIGS. 8A and 8B further includes an anti-reflection layer RPL.

The anti-reflection layer RPL may include a light shielding layer LBL and an overcoat layer OCL. An opening OP-LBL corresponding to the opening OP of the pixel defining layer PDL may be defined in the light shielding layer LBL.

The light shielding layer LBL contains a light shielding material. For example, the light shielding material may contain an organic material having a high light absorption rate. The light shielding layer LBL may contain a black pigment or a black dye. The light shielding layer LBL may contain a photosensitive organic material and a coloring agent such as, e.g., a pigment or a dye. The light shielding layer LBL may have a single layer or a multi-layer structure. The overcoat layer OCL may contain an organic material to remove the stepped portion that is formed by the light shielding layer LBL.

The light shielding layer LBL may be formed on the second insulation layer IS-IL2, and then the overcoat layer OCL may be formed on an entire surface thereof. The light shielding layer LBL may be formed by printing or patterning after coating.

Figure 9A:
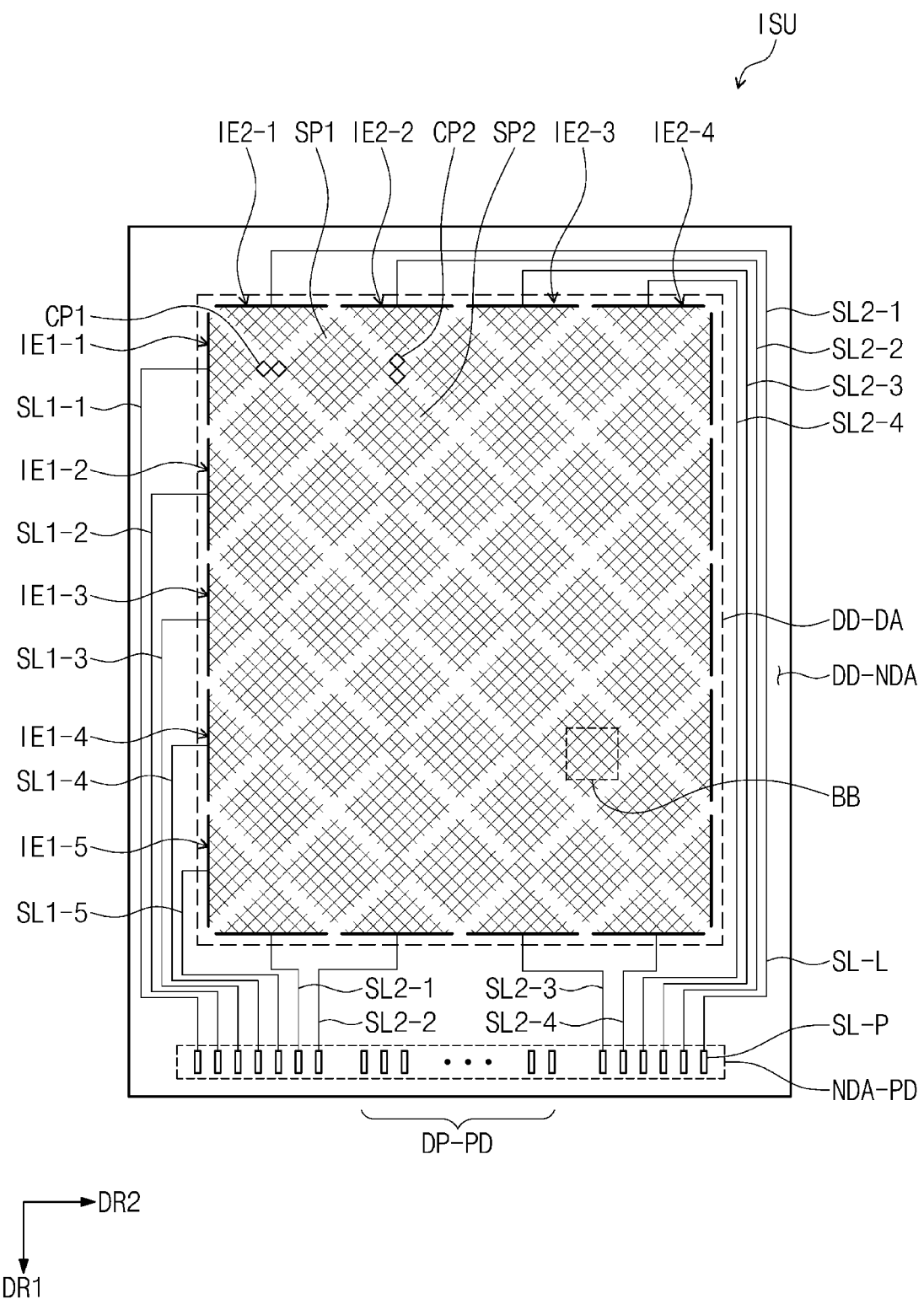
FIG. 9A is a plan view illustrating an input sensing unit according to an exemplary embodiment of the inventive concept.

FIG. 9A is a plan view illustrating an input sensing unit ISU according to an exemplary embodiment of the inventive concept. FIG. 9A is an enlarged view illustrating a region BB in FIG. 9A. Hereinafter, a detailed description regarding the same components as those of the display device DD described with reference to FIGS. 1 to 8B will be omitted.

Figure 9B:
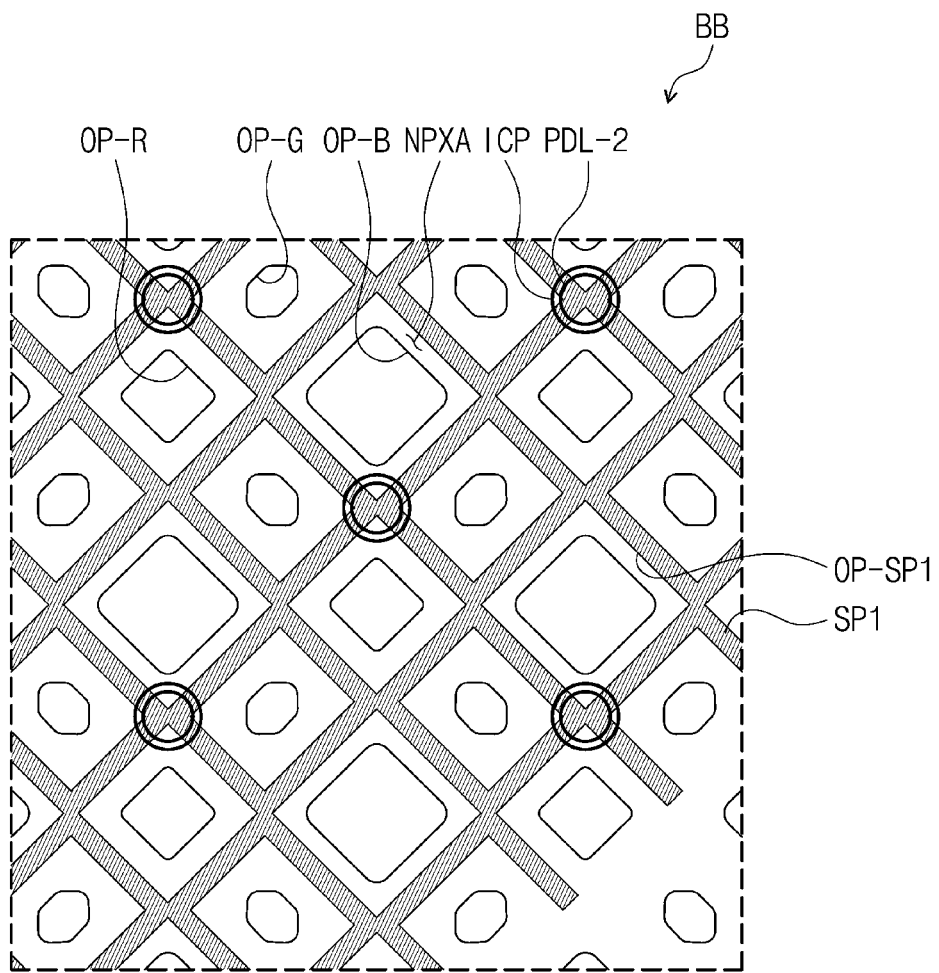
FIG. 9B is an enlarged plan view illustrating an input sensing unit according to an exemplary embodiment of the inventive concept.

As illustrated in FIG. 9B, each of the first sensing electrodes IE1-1 to IE1-5 and the second sensing electrodes IE2-1 to IE2-4 may have a mesh shape. As each of the first sensing electrodes IE1-1 to IE1-5 and the second sensing electrodes IE2-1 to IE2-4 has a mesh shape, the parasitic capacitance with the second electrode CE (refer to FIG. 7C) may be reduced. Also, as described later, since the first sensing electrodes IE1-1 to IE1-5 and the second sensing electrodes IE2-1 to IE2-4 non-overlap the light emitting areas PXA-R, PXA-G, and PXA-B, the first sensing electrodes IE1-1 to IE1-5 and the second sensing electrodes IE2-1 to IE2-4 are not visible to the user of the display device DD.

Although the first sensing electrodes IE1-1 to IE1-5 and the second sensing electrodes IE2-1 to IE2-4 may contain silver, aluminum, copper, chrome, nickel, and titanium, the inventive concept is not limited thereto. Although the input sensing unit ISU is formed through a continuous process, damage to the organic light emitting diodes OLED (refer to FIG. 7C) may be prevented.

According to this exemplary embodiment, similar to the input sensing unit ISU described with reference to FIGS. 6A to 6F, the first connecting parts CP1 may be formed from the first conductive layer IS-CL1, and the first sensor parts SP1, the second sensor parts SP2, and the second connecting parts CP2 may be formed from the second conductive layer IS-CL2. The input sensing unit ISU according to an exemplary embodiment of the inventive concept may further include dummy sensor parts that overlaps the first sensor parts SP1 and the second sensor parts SP2, which are formed from the first conductive layer IS-CL1. The dummy sensor parts may be connected to corresponding sensor parts of the first sensor parts SP1 and the second sensor parts SP2, respectively.

As illustrated in FIG. 9B, the first sensor part SP1 overlaps the non-light emitting area NPXA. Mesh lines of the first sensor part SP1 may define openings OP-SP1 corresponding to a first opening OP-G, a second opening OP-R, and a third opening OP-B. The mesh lines may have a three layer structure of titanium, aluminum, and titanium. Although the openings OP-SP1 one-to-one correspond to the first opening OP-G, the second opening OP-R, and the third opening OP-B in the drawing, the inventive concept is not limited thereto. Each of the openings OP-SP1 may correspond to two or more openings OP-G, OP-R, and OP-B.

Figure 10A:
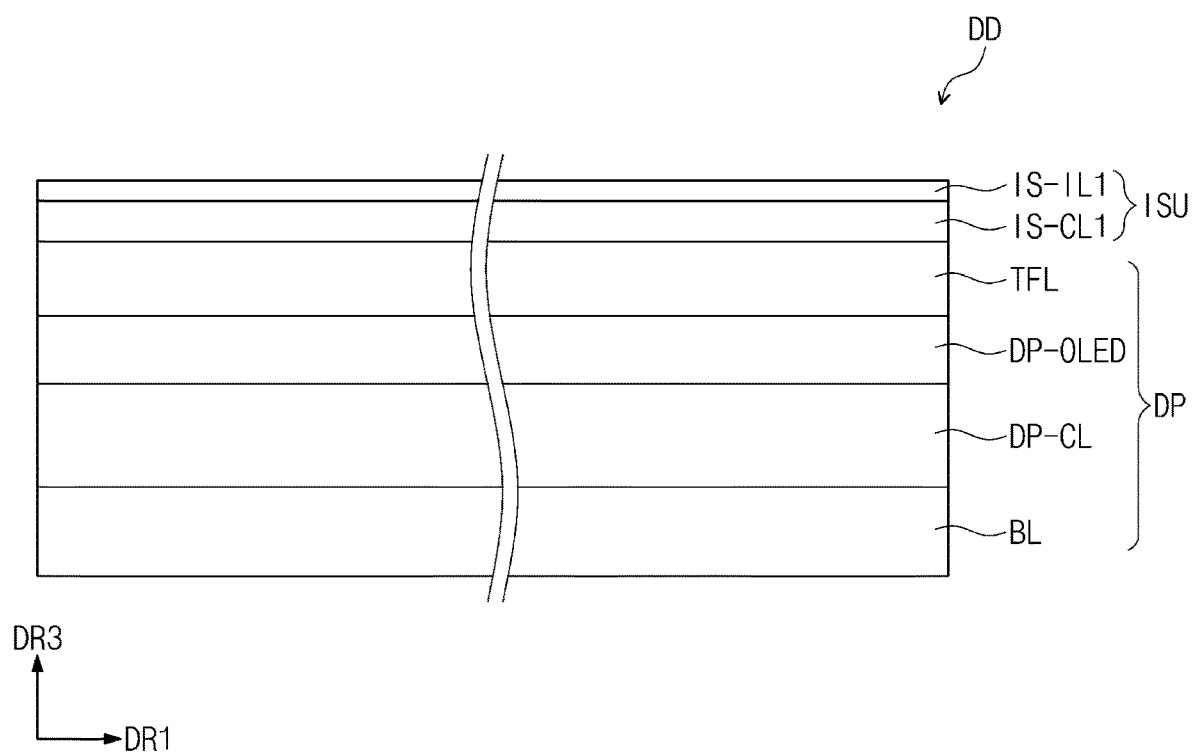
FIG. 10A is a cross-sectional view illustrating an input sensing unit according to an exemplary embodiment of the inventive concept.
Figure 10B:
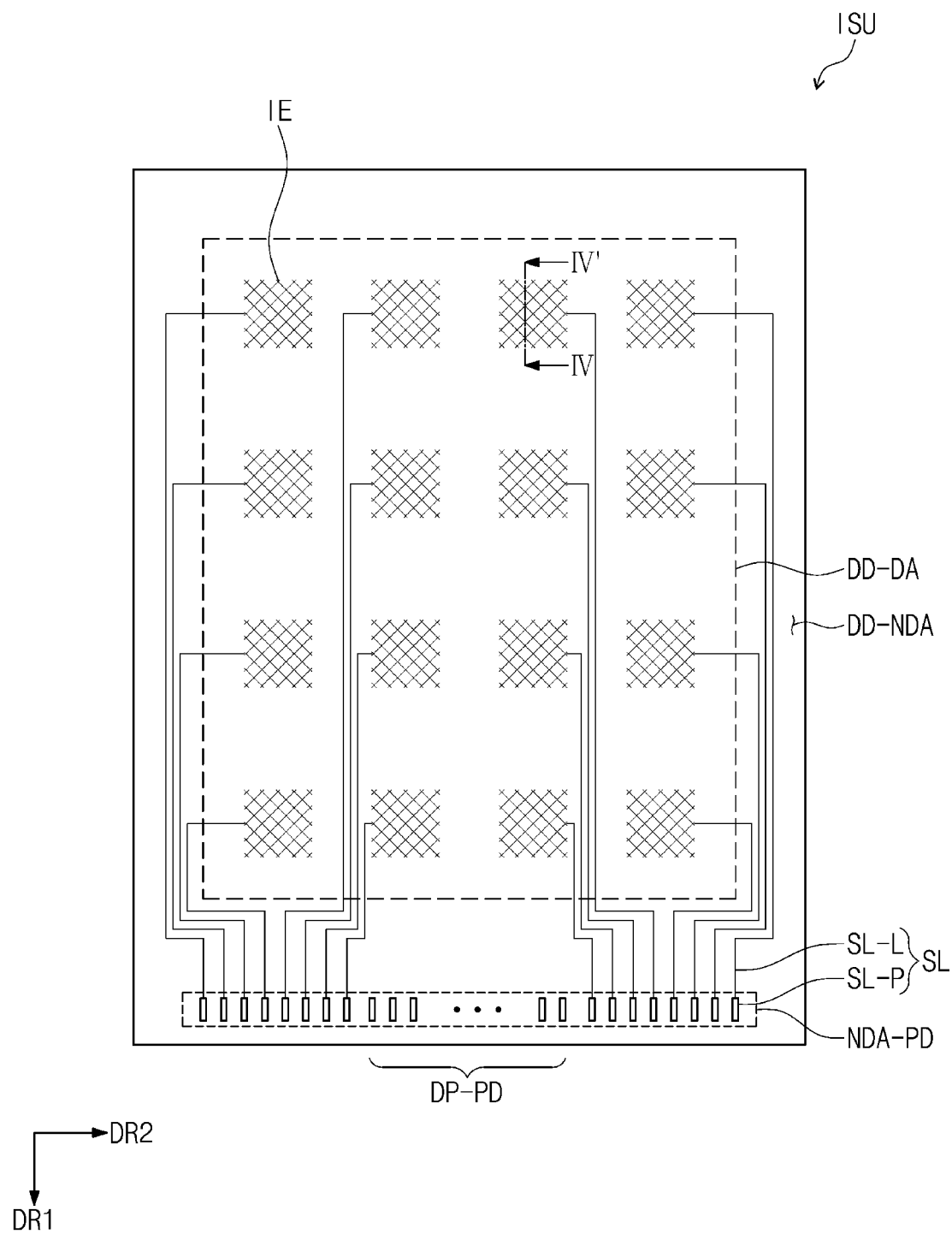
FIG. 10B is a plan view illustrating an input sensing unit according to an exemplary embodiment of the inventive concept.
Figure 10C:
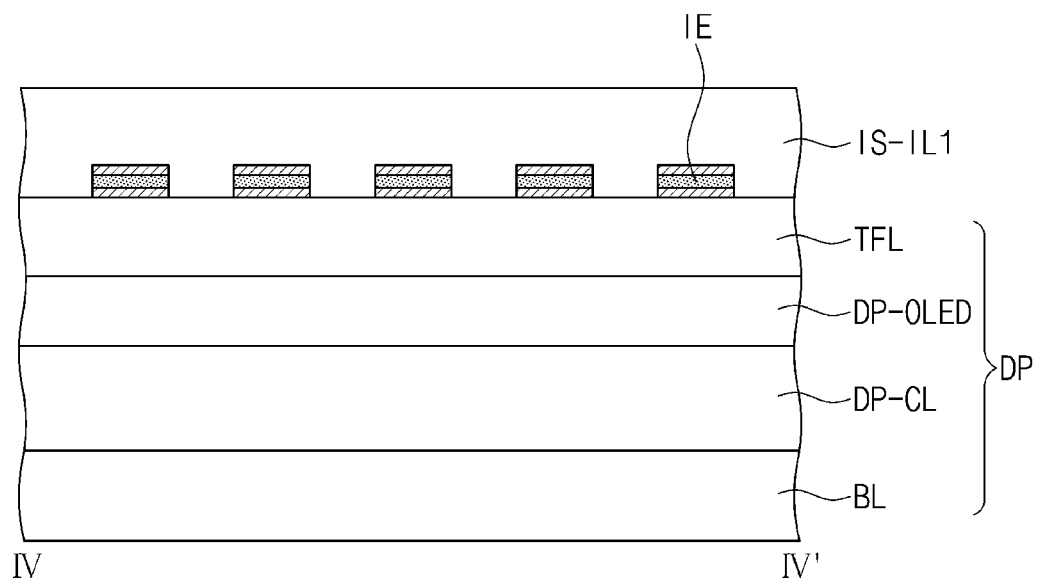
FIG. 10C is a partial cross-sectional view illustrating an input sensing unit according to an exemplary embodiment of the inventive concept.

FIG. 10A is a cross-sectional view illustrating a display device DD according to an exemplary embodiment of the inventive concept. FIG. 10B is a plan view illustrating an input sensing unit ISU according to an exemplary embodiment of the inventive concept. FIG. 10C is a cross-sectional view of FIG. 10B. Hereinafter, a detailed description regarding the same components as those of the display device DD described with reference to FIGS. 1 to 9B will be omitted.

In FIG. 10A, the display device DD is simply illustrated in order to explain a lamination relationship of the input detecting unit ISU. In comparison with the display device DD in FIG. 6A, the second conductive layer IS-CL2 and the second insulation layer IS0IL2 are omitted.

As illustrated in FIG. 10A, the input sensing unit ISU according to an embodiment of the inventive concept may include a first conductive layer IS-CL1 and a first insulation layer IS-IL1 directly covering (or contacting) the first conductive layer IS-CL1. The first conductive layer IS-CL1 includes a plurality of conductive patterns.

As illustrated in FIG. 10B, the input sensing unit ISU may include a plurality of sensing electrodes IE (hereinafter, referred to as sensing electrodes) and a plurality of signal lines SL (hereinafter, referred to as signal lines). The sensing electrodes IE have inherent coordinate information. For example, the sensing electrodes IE may be arranged in a matrix type and connected to the signal lines SL, respectively. Each of the signal lines SL may include a line part SL-L and a pad part SL-P. The inventive concept is not particularly limited to the shape and arrangement of the sensing electrodes IE. Some of the signal lines SL may be disposed on the display area DD-DA, and some thereof may be disposed on the non-display area DD-NDA. The input sensing unit ISU according to this exemplary embodiment may acquire coordinate information through the self cap method.

In FIG. 10C, the mesh lines having the three layer structure of titanium, aluminum, and titanium are exemplarily illustrated. Although the sensing electrodes IE having the mesh shape are exemplarily illustrated in this exemplary embodiment, the inventive concept is not limited thereto. Although the single layer type input sensing unit ISU including one type of sensing electrodes IE is exemplarily illustrated, the inventive concept is not limited thereto. The single layer type input sensing unit ISU according to an exemplary embodiment may include two types of sensing electrodes IE that transceive signals different from each other.

Figure 11A:
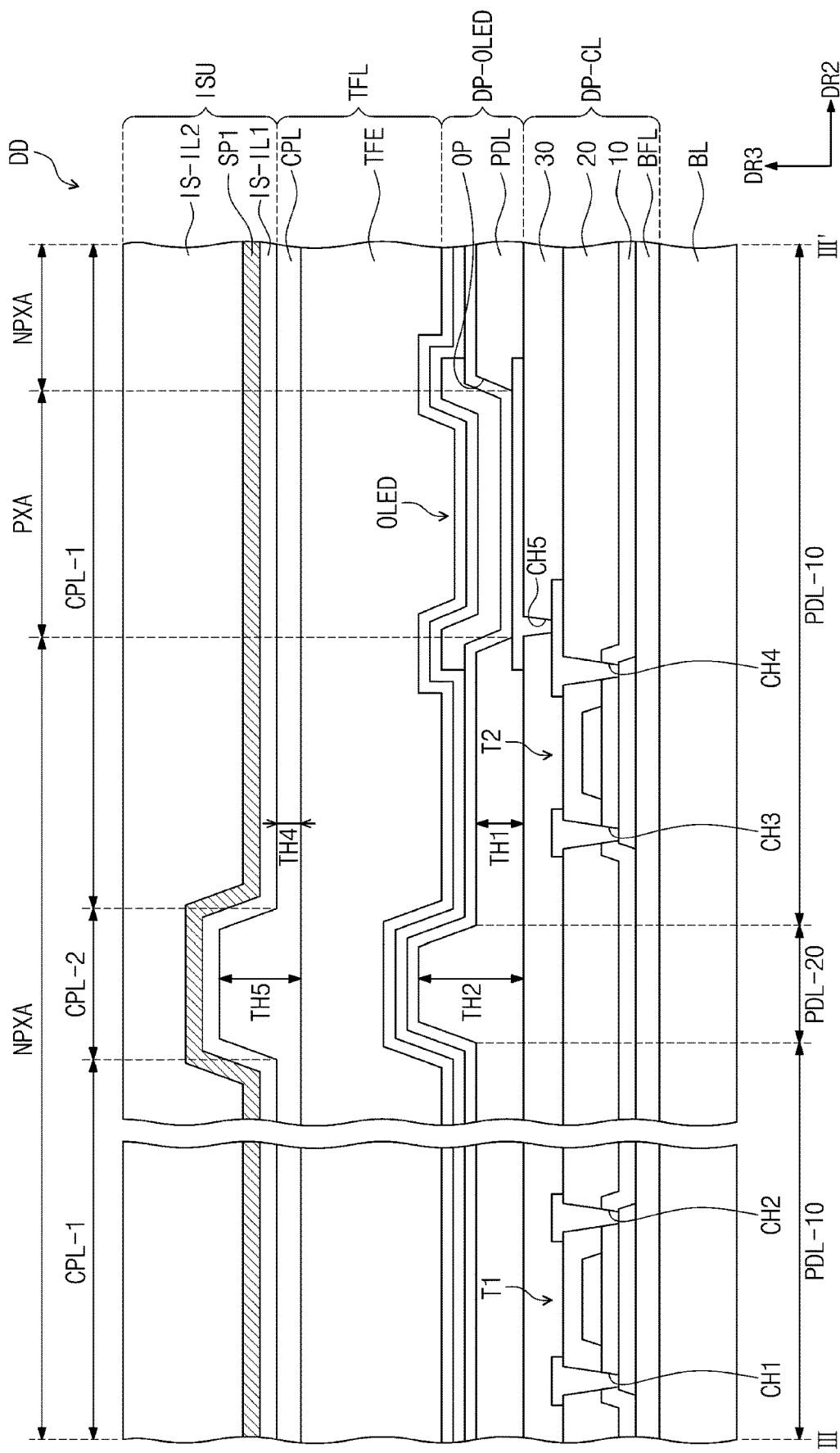
Figure 11B:
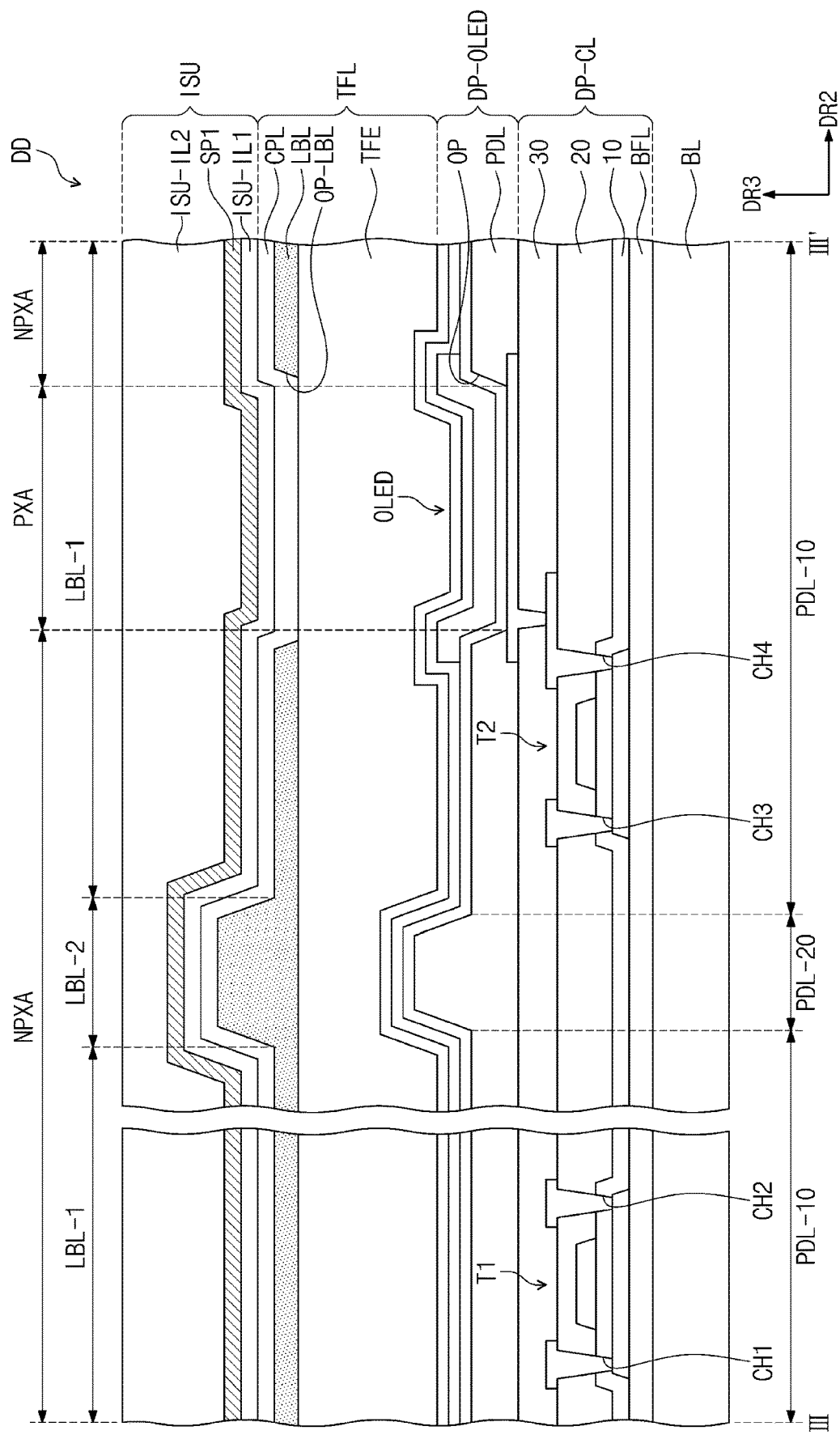
Figure 11C:
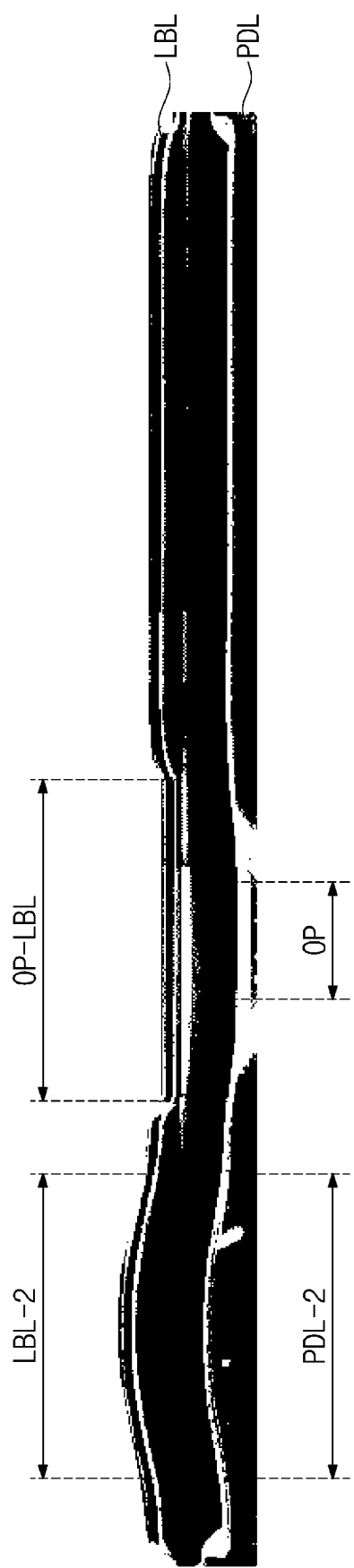

FIGS. 11A to 11D are cross-sectional views illustrating a display device DD according to an exemplary embodiment of the inventive concept. Hereinafter, detailed description regarding the same components as those described with reference to FIGS. 1 to 10C will be omitted. FIGS. 11A to 11D illustrate a cross-section corresponding to FIG. 7C. FIG. 11C is a photograph image corresponding to FIG. 11B.

In describing the display device DD in FIGS. 11A to 11D, two portions PDL-10 and PDL-20 of the pixel defining layer PDL is defined as described with reference to FIG. 3E. In this exemplary embodiment, the insulation pattern ICP in FIG. 7C is replaced by a "layer type structure". Here, the "layer type structure" is disposed on at least the display area DP-DA (refer to FIG. 3B), and an opening corresponding to the opening OP is defined therein.

In the display device DD in FIGS. 11A to 11C, one insulation layer of the upper insulation layer TFL has a function of the above-described insulation pattern ICP.

In the display element layer DP-OLED of FIG. 11A, the capping layer CPL corresponds to the one insulation layer. On a plane, the capping layer CPL may be divided into two portions. When the capping layer CPL contains an organic material, manufacturing thereof is easier. The capping layer CPL may include a first area CPL-1 corresponding to the first portion PDL-10 of the pixel defining layer PDL and a second area CPL-2 corresponding to the second portion PDL-20 of the pixel defining layer PDL.

The second area CPL-2 of the capping layer CPL has a thickness greater than that of the first area CPL-1 thereof. Each of the second portion PDL-20 and the second area CPL-20 has the same planar shape as that described with reference to FIG. 7B. A thickness difference between the second area CPL-2 of the capping layer CPL and the first area thereof may be substantially the same as that between the second portion PDL-20 and the first portion PDL-10.

Although not shown in FIG. 11A, the first connecting part CP1 (refer to FIG. 6E) may be disposed between the capping layer CPL and the first insulation layer ISU-IL1. Although the capping layer CPL is described as an insulation layer compensating a shape of the pixel defining layer PDL in this exemplary embodiment, the inventive concept is not limited thereto. For example, the capping layer CPL may be one of thin-films of the thin-film encapsulation layer TFE described with reference to FIGS. 5A to 5D. Here, the capping layer CPL may have a uniform thickness or be omitted.

As illustrated in FIGS. 11B and 11C, the upper insulation layer TFL may further include a light shielding layer LBL. The light shielding layer LBL may be disposed between the thin-film encapsulation layer TFE and the capping layer CPL. The light shielding layer LBL may include a first area LBL-1 corresponding to the first portion PDL-10 of the pixel defining layer PDL and a second area LBL-2 corresponding to the second portion PDL-20 of the pixel defining layer PDL. An opening OP-LBL corresponding to the opening OP of the pixel defining layer PDL may be defined in the first area LBL-1 of the light shielding layer LBL.

As illustrated in FIG. 11D, the display panel DP may further include a light shielding layer LBL disposed between the thin-film encapsulation layer TFE and the capping layer CPL. The light shielding layer LBL has a function of the above-described insulation pattern ICP.

The light shielding layer LBL may include a metal-containing layer LBL-M overlapping the first area LBL-1 and the second area LBL-2 and an organic material pattern LBL-O overlapping the second area LBL-2. An opening OP-LBL is defined in the metal containing layer LBL-M.

The metal-containing layer LBL-M may contain metal and/or a metal oxide. The metal containing layer LBL-M may contain a molybdenum tantalum oxide ($MoTaO_x$). In addition, the metal containing layer LBL-M may include one or more of a copper oxide (CuO), a chrome oxide (CrO), an iron oxide (FeO), and a nickel oxide ($Ni_2O_3$).

The organic material pattern LBL-O may have the substantially same thickness as that of the second portion PDL-2. The organic material pattern LBL-O may contain the same material as the organic light shielding material in FIG. 8A.

Figure 12A:
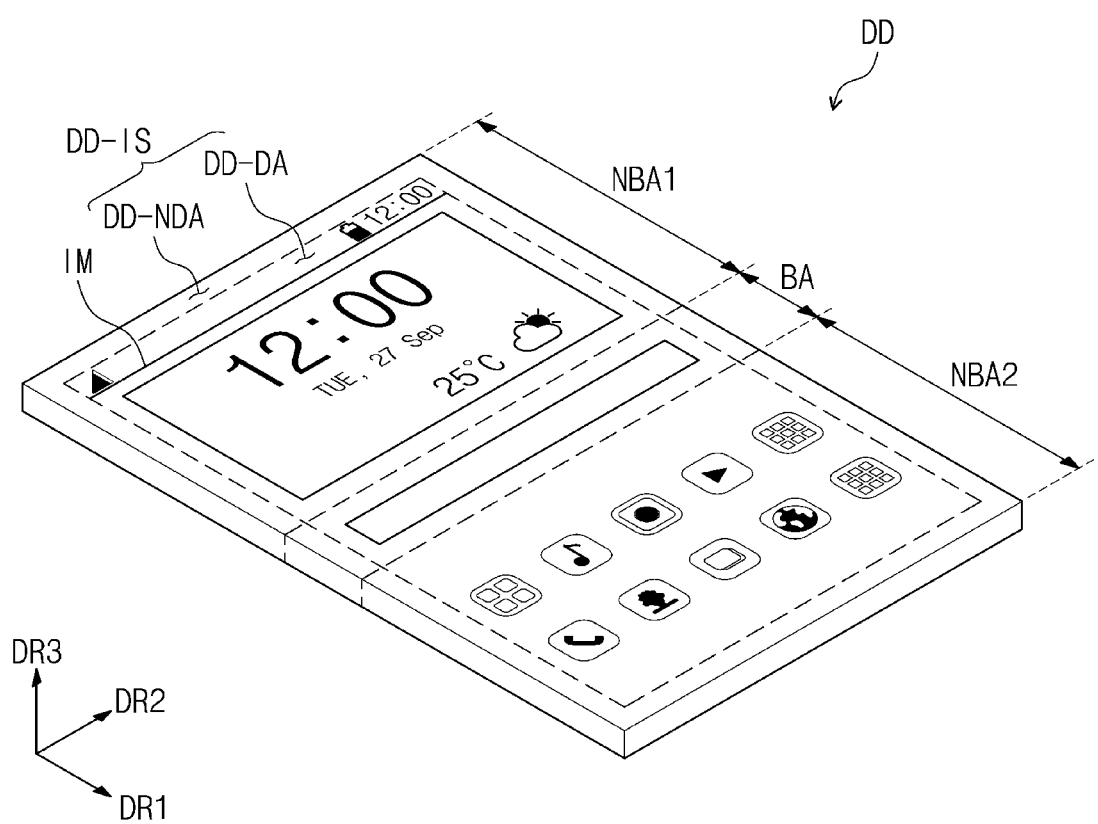
FIGS. 12A, 12B, and 12C are perspective views illustrating a display device according to an exemplary embodiment of the inventive concept.
Figure 12B:
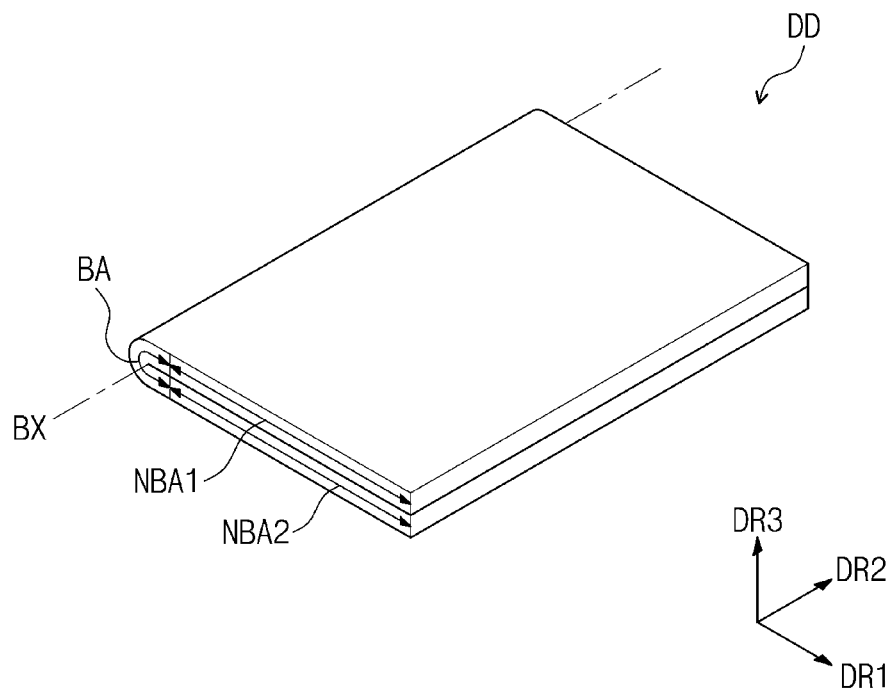
Figure 12C:
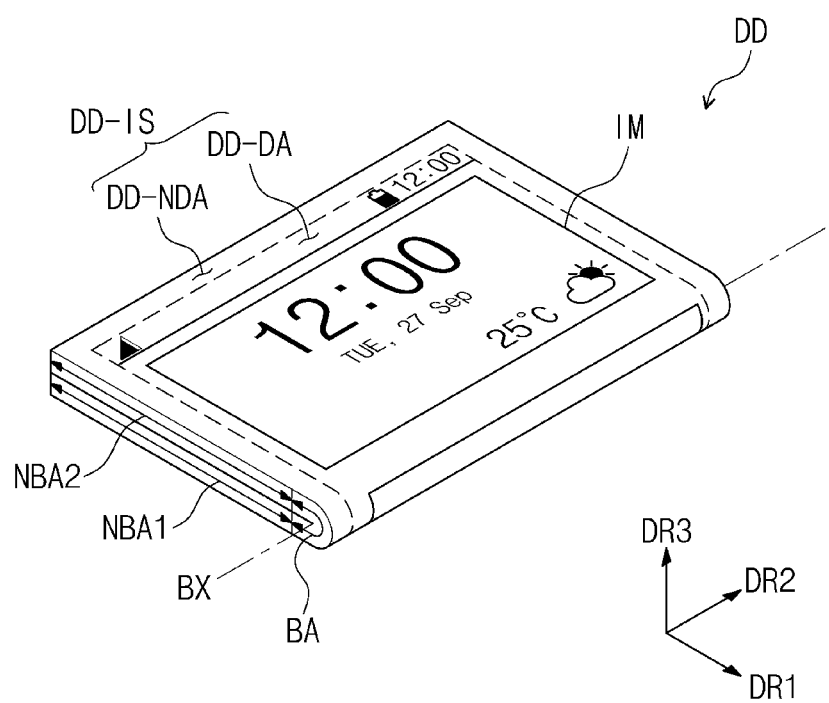
Figure 13A:
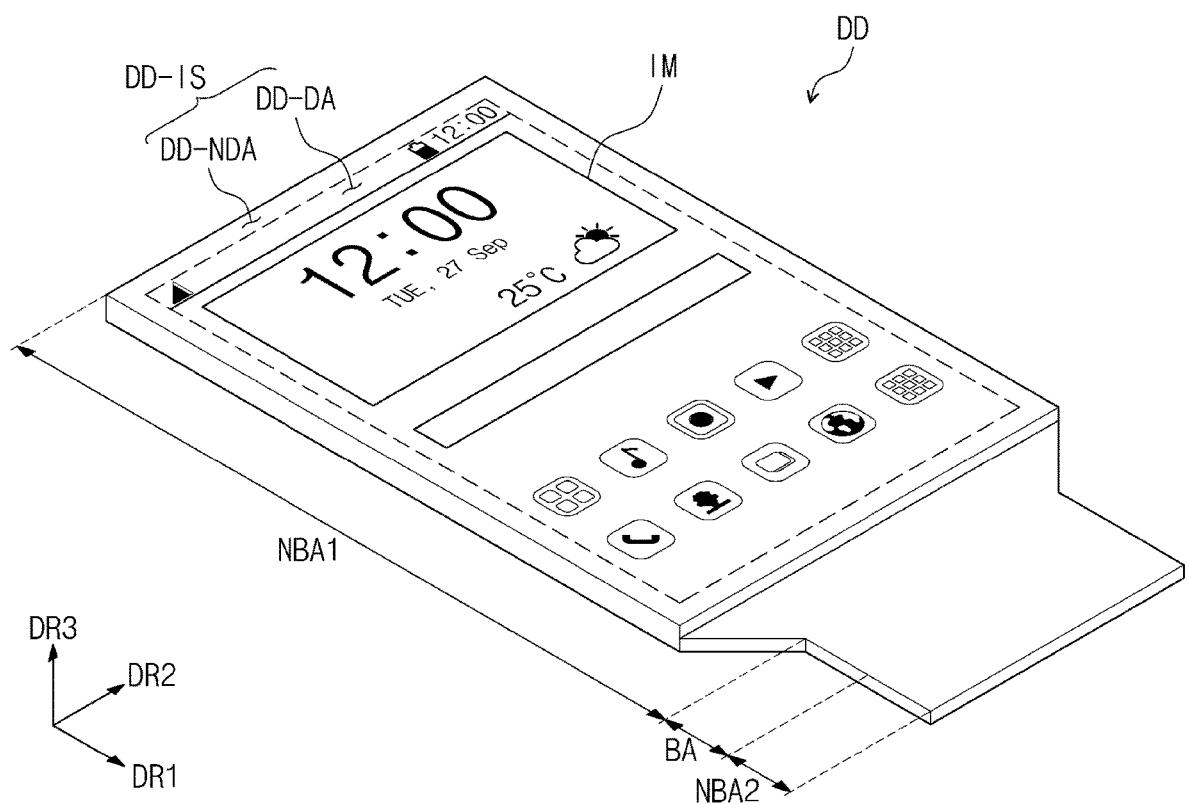
FIGS. 13A and 13B are perspective views illustrating a display device according to an exemplary embodiment of the inventive concept.
Figure 13B:
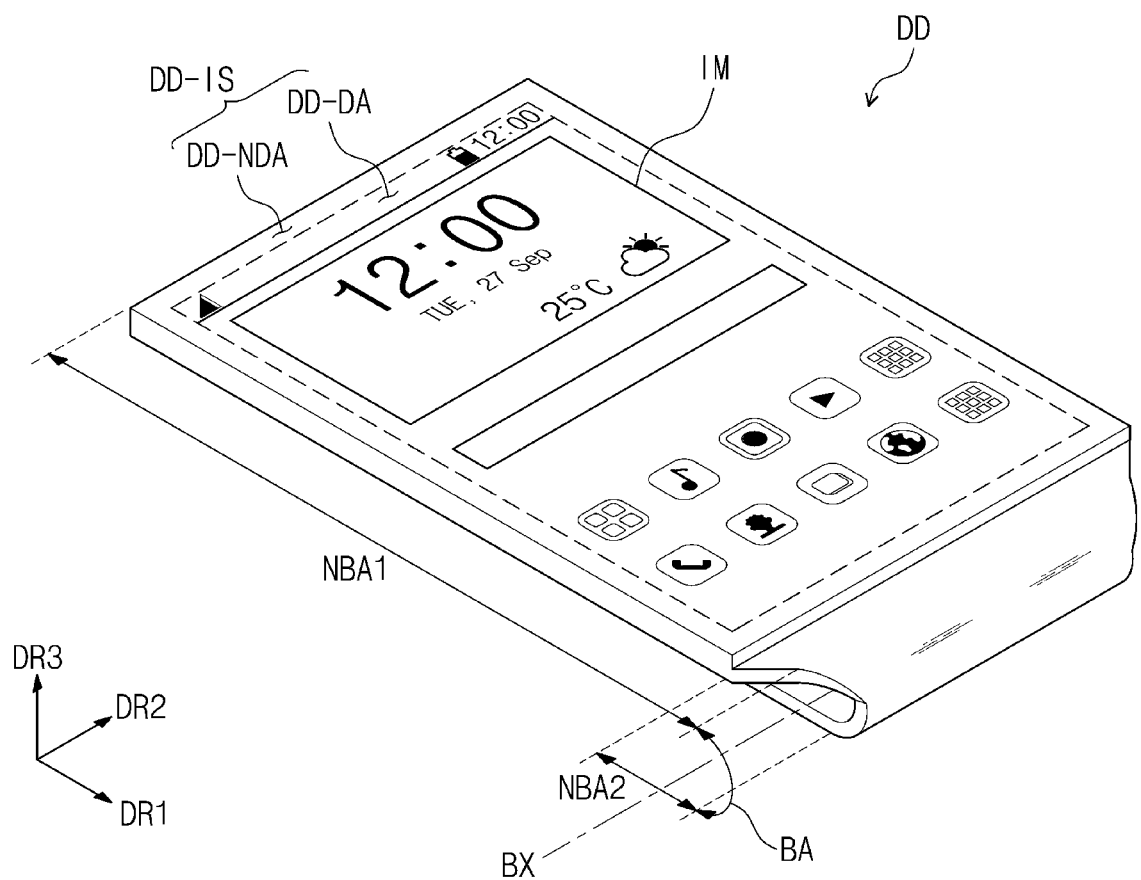
Figure 14:
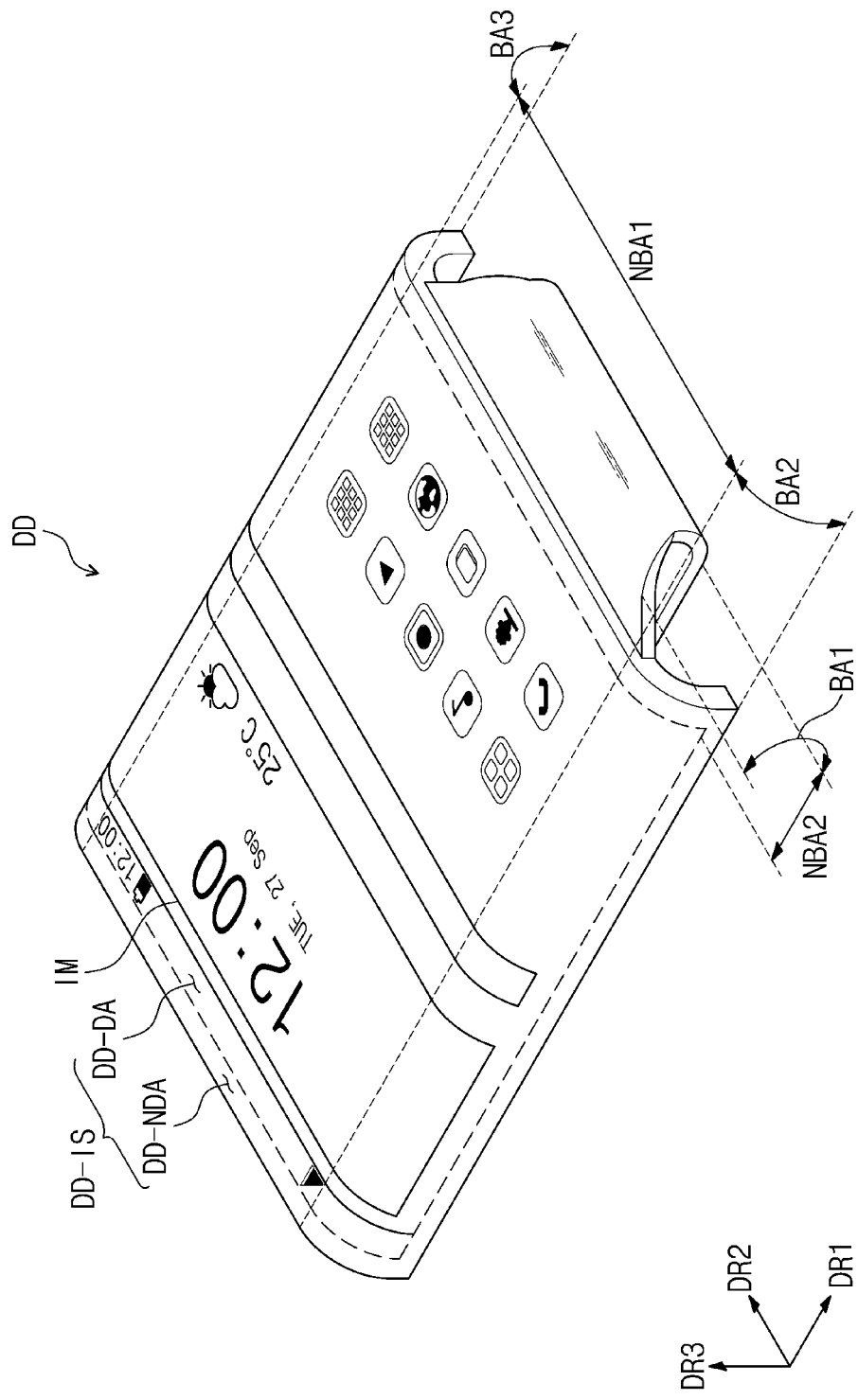
FIG. 14 is a perspective view illustrating a display device according to an exemplary embodiment of the inventive concept.

FIGS. 12A to 12C are cross-sectional views illustrating a display device DD according to an exemplary embodiment of the inventive concept. FIGS. 13A and 13B are perspective views illustrating a display device DD according to an exemplary embodiment of the inventive concept. FIG. 14 is a perspective view illustrating a display device DD according to an exemplary embodiment of the inventive concept. The display panel DP and the input sensing unit ISU, which are described with reference to FIGS. 1 to 11D, may be applied to a flexible display device DD, which will be described below.

As illustrated in FIGS. 12A to 12C, the display device DD may include a plurality of areas that are defined according to an operation type. The display device DD may include a first area NBA1, a second area NBA2, and a third area BA disposed therebetween. The third area BA is bent on the basis of a bending axis and substantially forms a curvature. Hereinafter, the first area NBA1, the second area NBA2, and the third area BA may be referred to as a first non-bending area NBA1, a second non-bending area NBA2, and a bending area BA.

As illustrated in FIG. 12B, the display device DD may be inwardly-bent so that a display surface DD-IS of the first non-bending area NBA1 faces a display surface DD-IS of the second non-bending area NBA2. As illustrated in FIG. 12C, the display module DM may be outwardly-bent so as to expose the display surface DD-IS to the outside.

In an exemplary embodiment of the inventive concept, the display device DD may include a plurality of bending areas BA. In addition, the bent area BA may be defined in correspondence to types in which the user manipulates the display device DD. For example, the bending area BA may be defined in parallel to the first directional axis DR1 or defined in a diagonal direction unlike FIGS. 12B and 12C. The bending area BA may have an area that is not fixed and determined according to a curvature thereof. In an exemplary embodiment of the inventive concept, the display device DD may repeat an operation mode in FIGS. 12A and 12B or an operation mode in FIGS. 12A and 12C.

As illustrated in FIGS. 13A and 13B, the display device DD may include a first non-bending area NBA1, a second non-bending area NBA2, and a bending area BA. The first non-bending area NBA1, the second non-bending area NBA2, and the bending area BA may be set with reference to the display panel DP (refer to FIGS. 2A to 2D). The input sensing unit, the anti-reflection unit, and the window unit may be disposed on only the first non-bending area NBA1.

As illustrated in FIG. 13A, the display panel DP may have a different width in the first direction DR1 according to areas thereof. Each of the bending area BA and the second non-bending area NBA2 may have a width less than that of the first non-bending area NBA1. As the bending area BA has a relatively small width, the bending is easily performed. In FIG. 13A, the first non-bending area NBA1 may include a boundary area in which a width gradually decreases. In an exemplary embodiment of the inventive concept, the boundary area in which a width gradually decreases may be omitted. As illustrated in FIG. 13B, in a bent state, the second non-bending area NBA2 faces the first non-bending area NBA1 while being spaced apart from the first non-bending area NBA1.

As illustrated in FIG. 14, the display device DD may include three bending areas BA1, BA2, and BA3. When compared with the display device DD in FIG. 13B, the second and third bending areas may be defined such that two edge areas, which face in the second direction DR2, of the first non-bending area NBA1 are bent from a central area. The first bending area BA1 may correspond to the bending area BA in FIGS. 13A and 13B. The input sensing unit ISU, the anti-reflection unit RPU, and the window unit WU in FIGS. 2A to 2D may overlap the first non-bending area NBA1, the second bending area BA2, and the third bending area BA3.

As described above, the insulation structure compensates for the distance between the second electrode and the sensing electrode, which is not uniform due to the shape of the pixel defining layer. Accordingly, because the distance between the second electrode and the sensing electrode is uniform, noise of the input sensing unit caused by effects of the display panel is reduced.

The insulation structure may be realized by the light shielding layer. The light shielding layer decreases the reflectance of external light. Also, as the color of the reflected light is distributed in a narrow manner, the color characteristics of the reflected light may be enhanced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A display device comprising:
a display panel; and
an input sensing unit comprising a sensing electrode and disposed directly on the display panel,
wherein:
the display panel comprises:
a light emitting element comprising a first electrode disposed on a base insulation layer, a second electrode, and a light emitting layer disposed between the first electrode and the second electrode;
a pixel defining layer disposed between the second electrode and the base insulation layer, and comprising a first portion having a flat upper surface extending in a direction substantially parallel to the base insulation layer, in which an opening to expose the first electrode is defined, and a second portion, which is disposed adjacent to the first portion and has a thickness greater than that of the first portion; and
a plurality of insulation layers disposed on the second electrode; and
one of the plurality of insulation layers comprises a first area, which overlaps the first portion of the pixel defining layer, and a second area, which overlaps the second portion of the pixel defining layer and has a thickness greater than that of the first area.

2. The display device of claim 1, wherein a difference in thickness between the second area and the first area is substantially the same as a thickness between the second portion and the first portion.

3. The display device of claim 1, wherein the second portion overlaps about 90% or more of the second area on a plane.

4. The display device of claim 1, wherein the sensing electrode contacts the one of the plurality of insulation layers.

5. The display device of claim 1, wherein the one of the plurality of insulation layers is formed with an opening corresponding to the opening of the first portion.

6. The display device of claim 5, wherein the one of the insulation layers comprises a light shielding material.

7. A display device comprising:
a display panel; and
an input sensing unit comprising a sensing electrode and disposed directly on the display panel,
wherein:
the display panel comprises:
a light emitting element comprising a first electrode disposed on a base insulation layer, a second electrode, and a light emitting layer disposed between the first electrode and the second electrode;
a pixel defining layer disposed between the second electrode and the base insulation layer, and comprising a first portion, in which an opening to expose the first electrode is defined, and a second portion, which is disposed adjacent to the first portion and has a thickness greater than that of the first portion; and
a plurality of insulation layers disposed on the second electrode;
one of the plurality of insulation layers comprises a first area, which overlaps the first portion of the pixel defining layer, and a second area, which overlaps the second portion of the pixel defining layer and has a thickness greater than that of the first area;
the plurality of insulation layers comprise a first inorganic layer contacting the second electrode, a second inorganic layer disposed on the first inorganic layer, an organic layer disposed on the second inorganic layer, a third inorganic layer disposed on the organic layer, and a fourth inorganic layer disposed on the third inorganic layer; and
the one of the plurality of insulation layers is one of the first inorganic layer, the second inorganic layer, the organic layer, and the third inorganic layer.

* * * * *